United States Patent
Ning et al.

(10) Patent No.: US 9,136,223 B2
(45) Date of Patent: Sep. 15, 2015

(54) FORMING ALIGNMENT MARK AND RESULTING MARK

(71) Applicant: GLOBALFOUNDRIES Inc., Grand Cayman (KY)

(72) Inventors: Guoxiang Ning, Ballston Lake, NY (US); Soon Yoeng Tan, Singapore (SG); Seok Yan Poh, Singapore (SG); Paul Ackmann, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 196 days.

(21) Appl. No.: 13/952,231

(22) Filed: Jul. 26, 2013

(65) Prior Publication Data

US 2015/0028500 A1  Jan. 29, 2015

(51) Int. Cl.
*H01L 21/70* (2006.01)
*H01L 23/544* (2006.01)
*G03F 7/20* (2006.01)
*G03F 1/42* (2012.01)
*G03F 9/00* (2006.01)

(52) U.S. Cl.
CPC ............... *H01L 23/544* (2013.01); *G03F 1/42* (2013.01); *G03F 7/70633* (2013.01); *G03F 7/70683* (2013.01); *G03F 9/7076* (2013.01); *H01L 21/70* (2013.01); *H01L 2223/5442* (2013.01); *H01L 2223/54426* (2013.01); *H01L 2223/54453* (2013.01)

(58) Field of Classification Search
CPC ........................................................ H01L 21/70
See application file for complete search history.

(56) References Cited

U.S. PATENT DOCUMENTS

| 5,695,897 | A | * | 12/1997 | Mitome et al. | 430/22 |
| 5,710,050 | A | * | 1/1998 | Makita et al. | 438/486 |
| 6,350,548 | B1 | * | 2/2002 | Leidy et al. | 430/22 |
| 6,525,818 | B1 | * | 2/2003 | Yin et al. | 356/400 |
| 6,778,275 | B2 | * | 8/2004 | Bowes | 356/400 |
| 7,180,593 | B2 | * | 2/2007 | Lin | 356/401 |
| 8,922,774 | B2 | * | 12/2014 | Sentoku et al. | 356/401 |
| 2001/0049589 | A1 | * | 12/2001 | Yasuda et al. | 702/150 |
| 2003/0054574 | A1 | * | 3/2003 | Tanaka et al. | 438/4 |
| 2003/0174879 | A1 | * | 9/2003 | Chen | 382/151 |
| 2005/0023709 | A1 | * | 2/2005 | Chien | 257/797 |
| 2005/0048741 | A1 | * | 3/2005 | Phan et al. | 438/462 |
| 2005/0068508 | A1 | * | 3/2005 | Mattiza et al. | 355/55 |
| 2005/0118532 | A1 | * | 6/2005 | Mallmann et al. | 430/311 |
| 2008/0034344 | A1 | * | 2/2008 | Chiu et al. | 716/21 |

* cited by examiner

*Primary Examiner* — Lex Malsawma
(74) *Attorney, Agent, or Firm* — Ditthavong & Steiner, P.C.

(57) ABSTRACT

Methods for forming an alignment mark and the resulting mark are disclosed. Embodiments may include forming a first shape having rotational symmetry; forming a second shape; and forming an alignment mark by combining the first shape and one or more of the second shape, wherein the alignment mark has rotational symmetry.

17 Claims, 42 Drawing Sheets

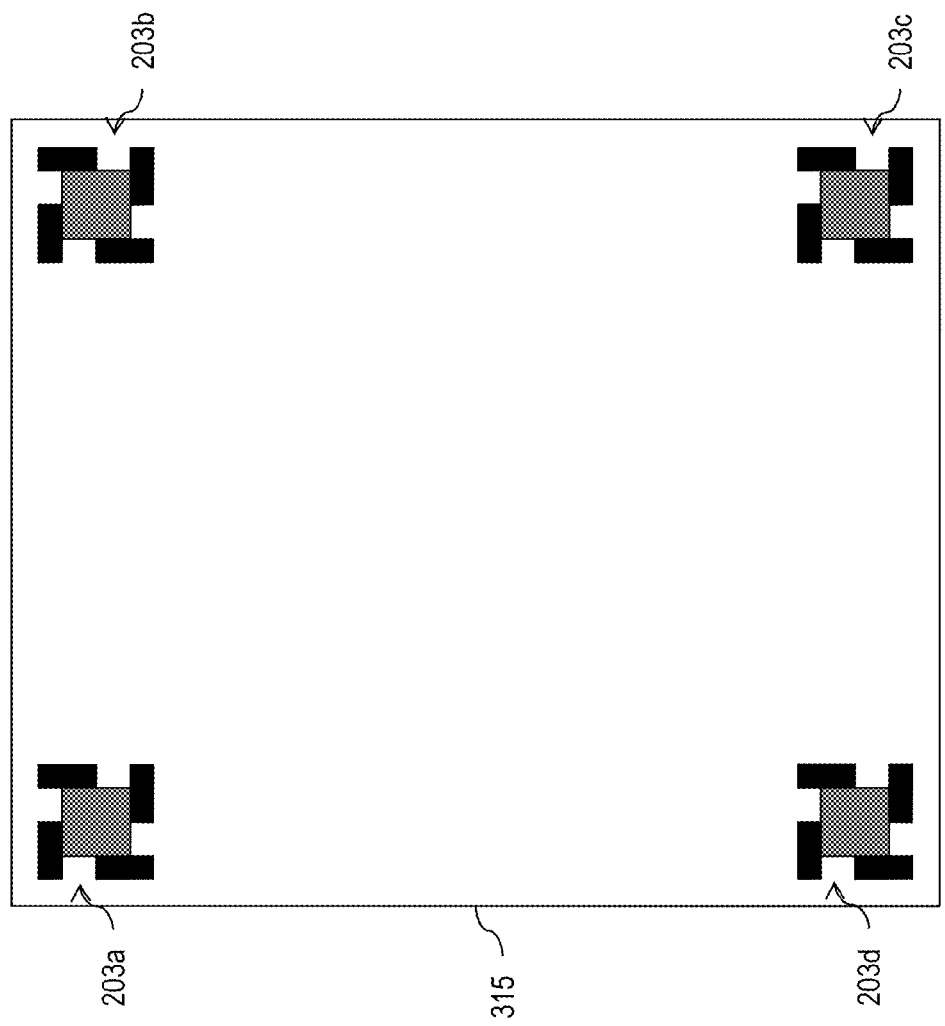

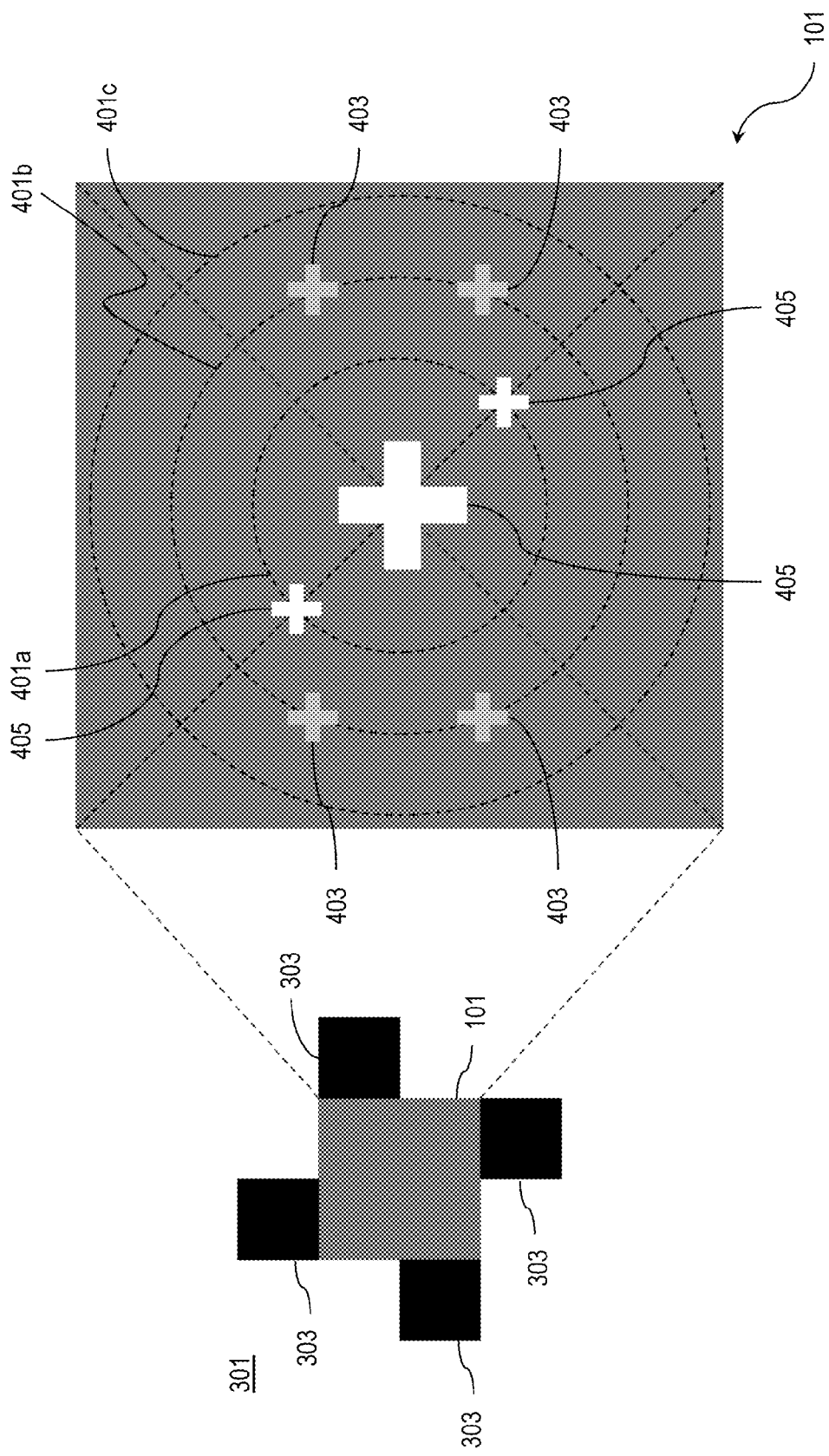

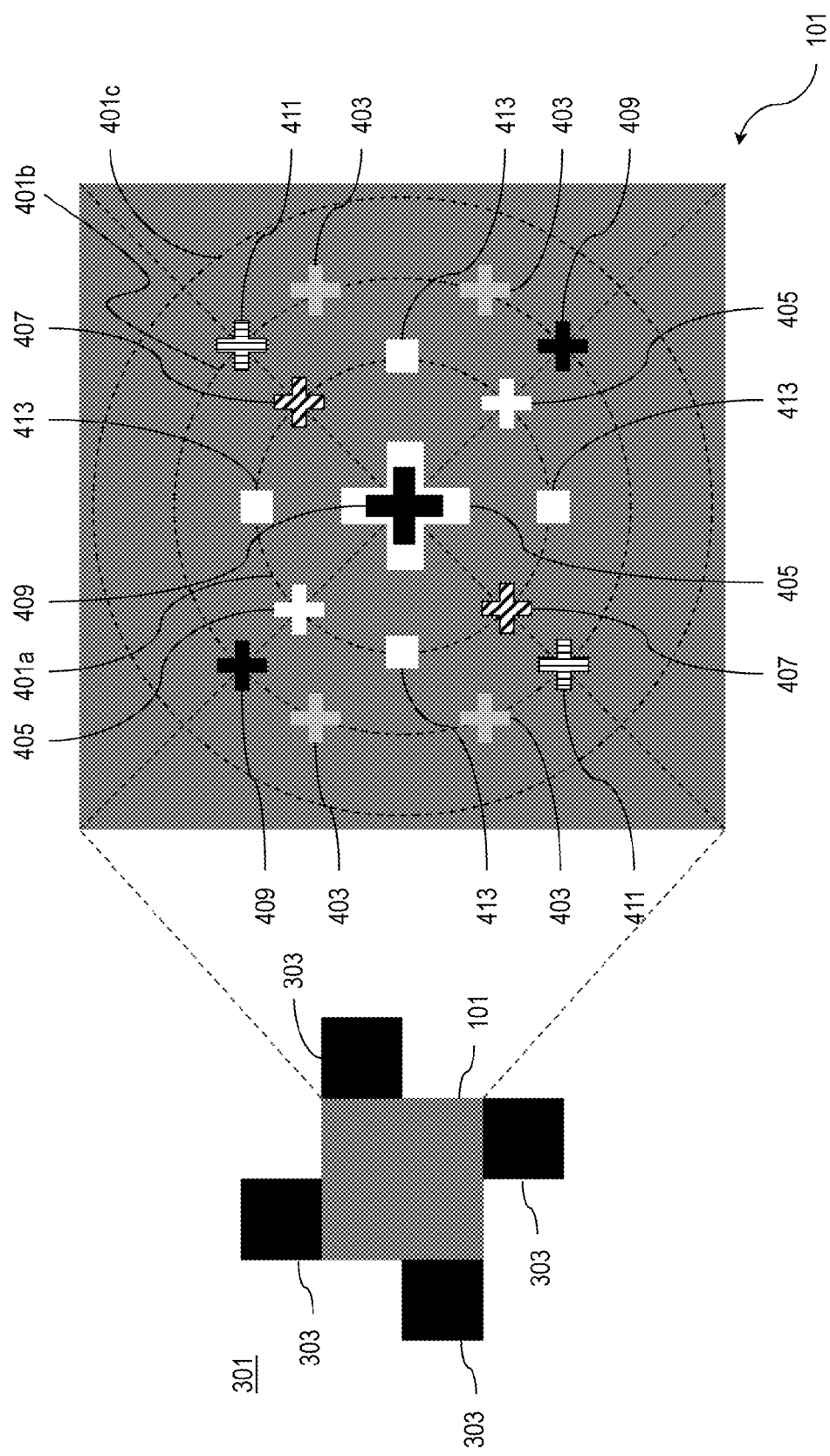

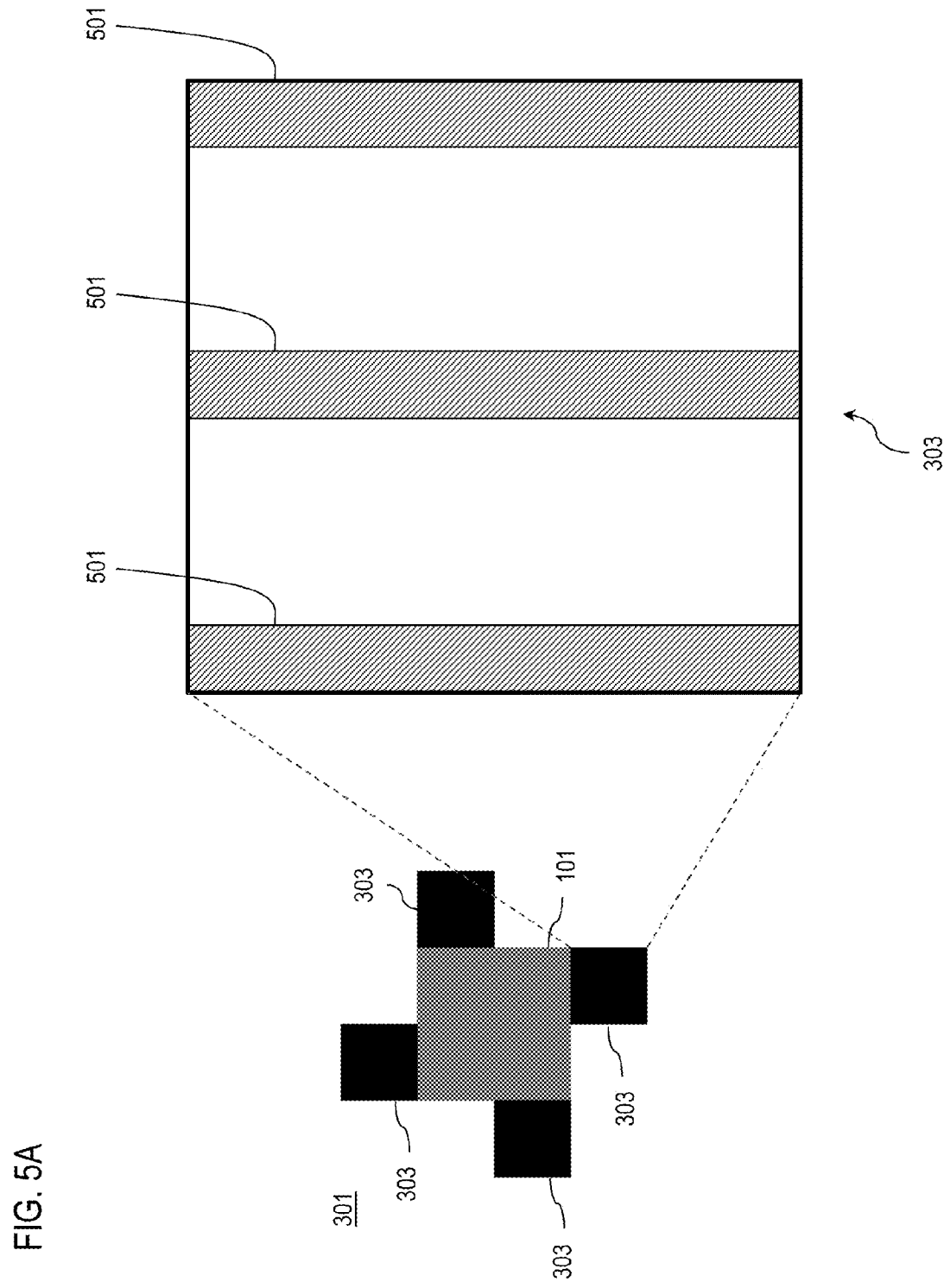

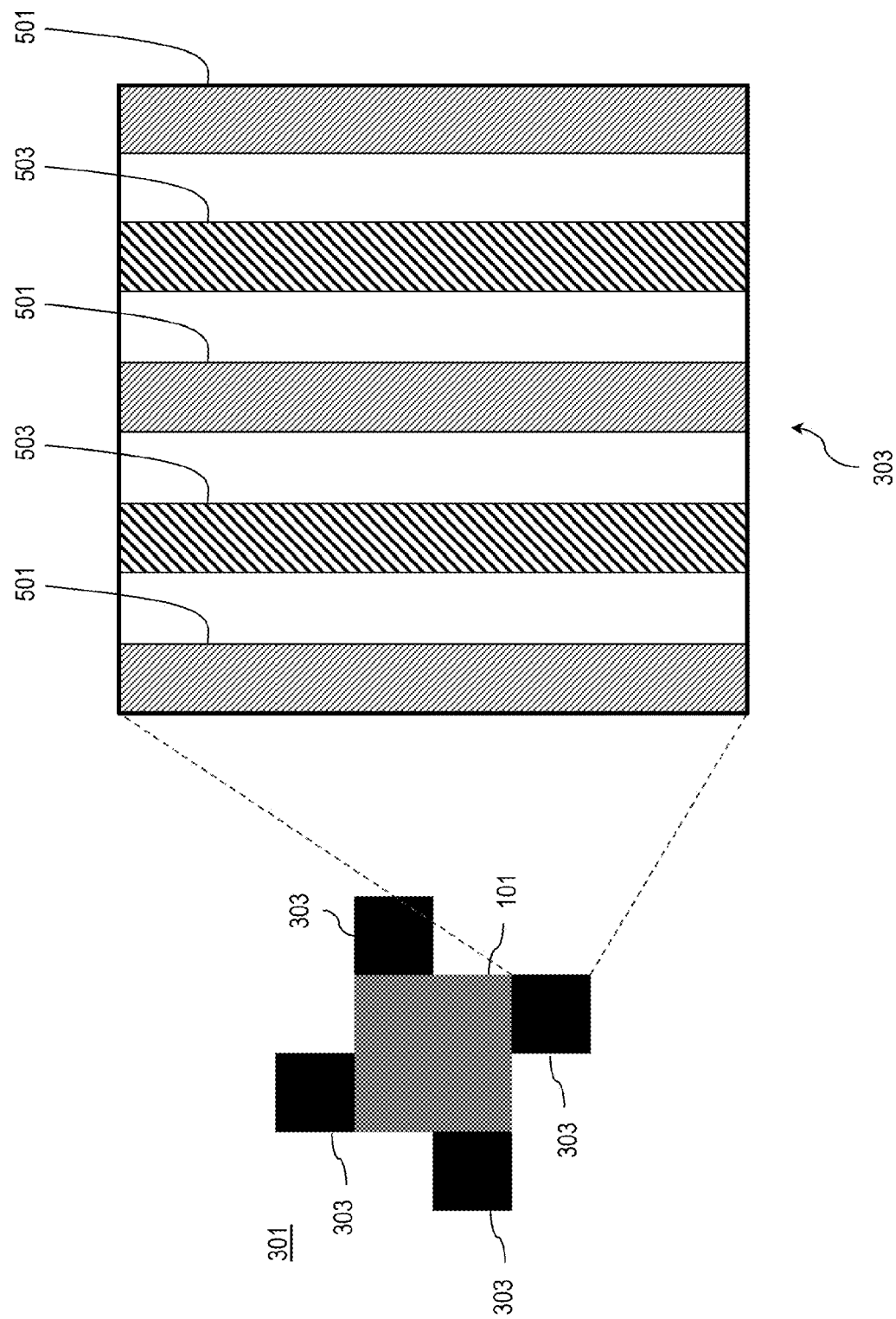

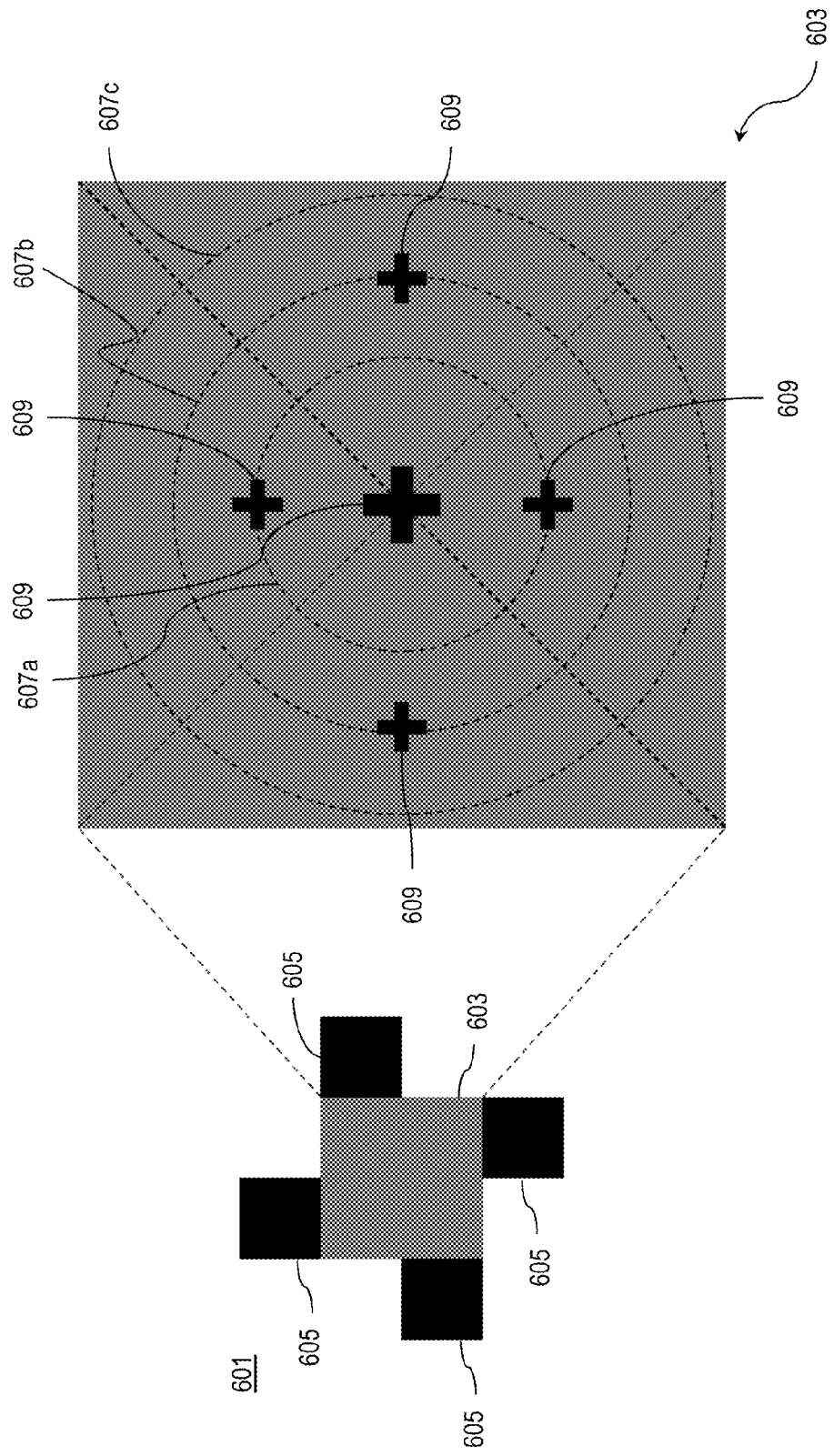

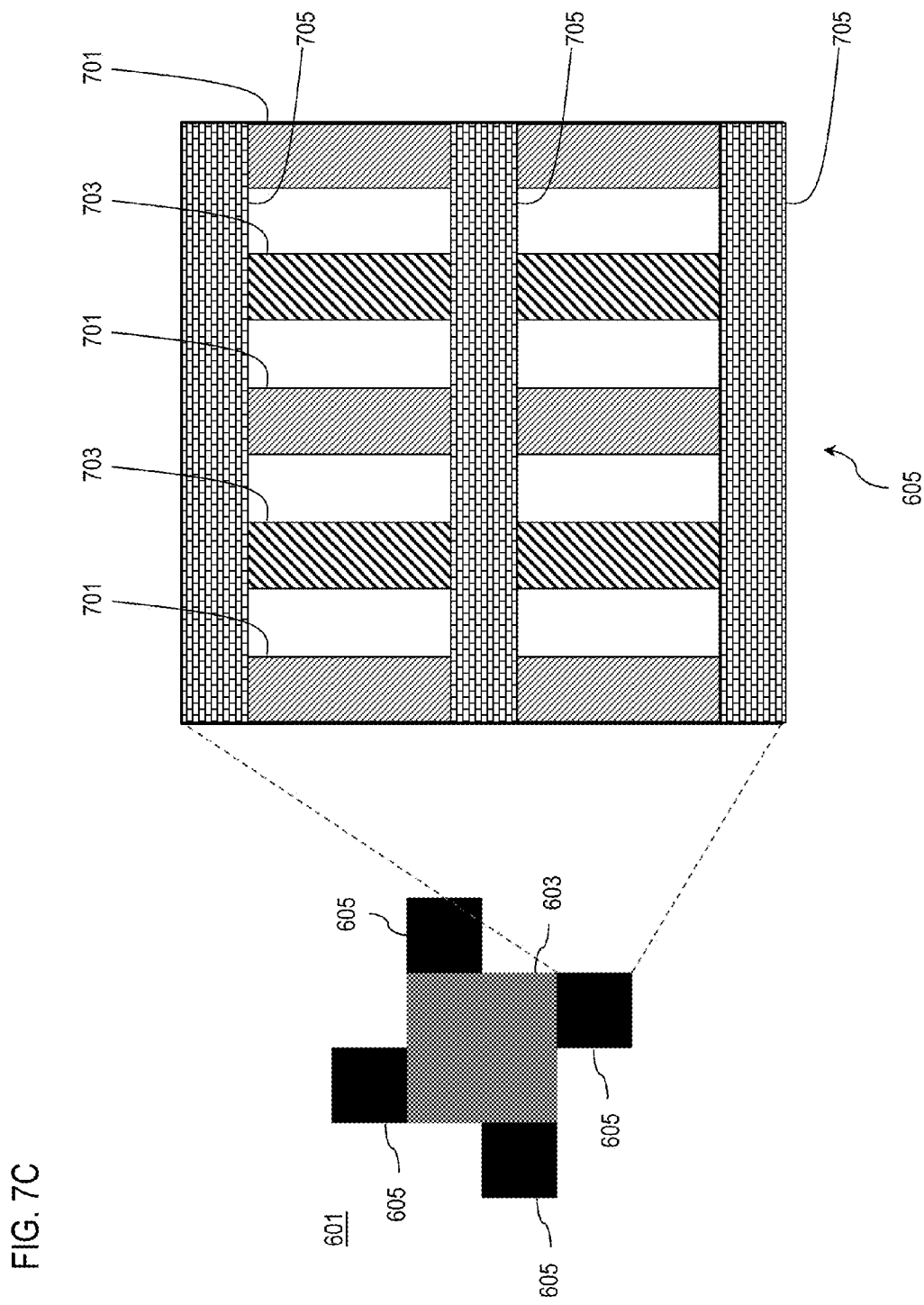

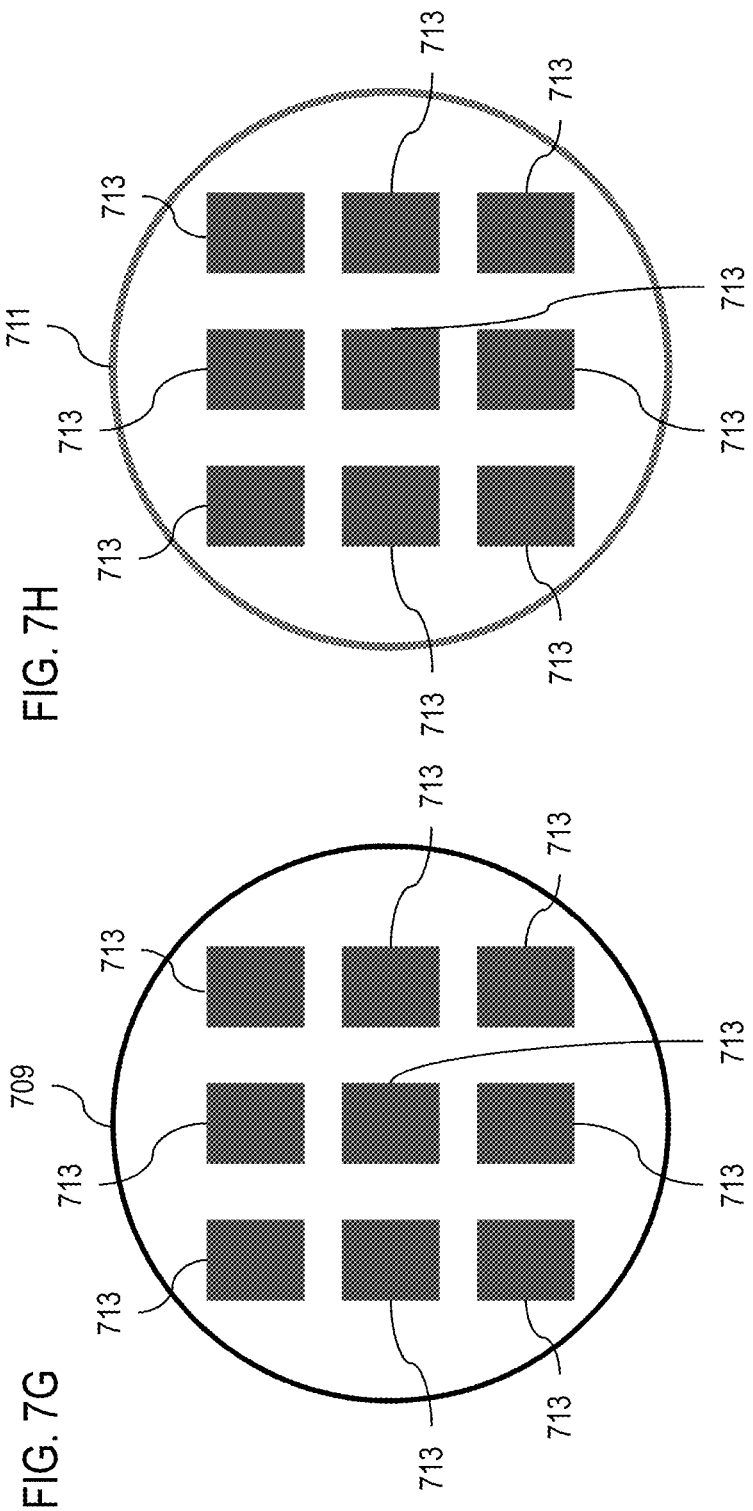

FORMING ALIGNMENT MARK AND RESULTING MARK

TECHNICAL FIELD

The present disclosure relates to alignment marks. The present disclosure is particularly applicable to alignment marks for semiconductor alignment and inspection purposes, and is particularly applicable to 28 nanometer (nm) technology nodes and beyond.

BACKGROUND

Existing alignment marks can be used in kerf or prime areas on semiconductor wafers for reference during optical global alignment (OGA). Such alignment marks can be any kind of unique structure. However, it can be time consuming to find suitable structures for use in scanning electronic microscope global alignment (SEMGA), which is at relatively smaller sizes. Further, existing alignment marks cannot provide for reticle inspection alignment in a pattern area for rotation inspection or overlay measurements, such as scanning electronic microscopic overlay measurements and/or optical overlay measurements.

A need therefore exists for a method of forming a general alignment mark that can be used for various purposes, and the resulting mark.

SUMMARY

An aspect of the present disclosure is a method of forming an alignment mark capable of use in OGA, SEMGA, overlay measurement, and reticle inspection.

Another aspect of the present disclosure is a substrate including an alignment mark capable of use in OGA, SEMGA, overlay measurement, and reticle inspection.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a first shape having rotational symmetry; forming a second shape; and forming an alignment mark by combining the first shape and one or more of the second shape, wherein the alignment mark has rotational symmetry.

An aspect of the present disclosure includes forming the alignment mark by combining the first shape with four of the second shape. Another aspect includes placing an edge of each one of the four second shapes contiguous with a separate edge of the first shape to form the alignment mark. Yet another aspect includes the first shape being a square and the second shape being a quadrilateral. Another aspect includes forming one or more concentric outlines within the first shape corresponding to a number of levels of exposure. Yet another aspect includes forming rotationally symmetric shapes along the one or more concentric outlines corresponding to features formed in the levels of exposure. An additional aspect includes forming a cross-hatched grid of lines within the second shape corresponding to features formed in a number of levels of exposure. Still another aspect includes forming rotationally symmetric shapes at intersections of the cross-hatched grid of lines.

Another aspect of the present disclosure is a device including: a substrate; and one or more rotationally symmetric alignment marks on the substrate, wherein the one or more rotationally symmetric alignment marks include: a first shape having rotational symmetry; and at least one of a second shape.

Aspects include the one or more alignment marks including four of the second shape. Yet another aspect includes the one or more alignment marks including an edge of each one of the four second shapes being contiguous with a separate edge of the first shape. An additional aspect includes the first shape being a square and the second shape being a quadrilateral. Yet another aspect includes the first shape further including: one or more concentric outlines corresponding to a number of levels of exposure. Still another aspect includes the first shape further including: rotationally symmetric shapes along the one or more concentric outlines corresponding to features formed in the levels of exposure. Another aspect includes the second shape further including: a cross-hatched grid of lines corresponding to features formed in a number of levels of exposure. Yet a further aspect includes the second shape further including rotationally symmetric shapes at intersections of the cross-hatched grid of lines.

Another aspect of the present disclosure is a method including: forming a first shape having 90-degree rotational symmetry; and forming at least one of a second shape, with an edge of each of the at least one second shape being contiguous with a separate edge of the first shape, forming an alignment mark, wherein the alignment mark has 90-degree rotational symmetry.

An additional aspect includes forming one or more concentric outlines within the first shape corresponding to a number of levels of exposure; and forming 90-degree rotationally symmetric shapes along the one or more concentric outlines corresponding to features formed in the levels of exposure. Yet another aspect includes forming a cross-hatched grid of lines within the second shape corresponding to features formed in a number of levels of exposure; and forming rotationally symmetric shapes at intersections of the cross-hatched grid of lines. Still another aspect includes the first shape being a square and the second shape being a quadrilateral.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 3F and 3H illustrate alignment mark placement in corners of a reticle field, in accordance with exemplary embodiments;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limited functionality and specificity attendant upon alignment marks. In accordance with embodiments of the present disclosure, a general alignment mark is described for use in OGA, SEMGA, in addition to overlay measurements and reticle inspection alignment.

Methodology in accordance with an embodiment of the present disclosure includes forming a first shape having rotational symmetry. The first shape may be a square. A second shape is then formed, one or more of which are combined with the first shape to form an alignment mark with rotational symmetry. The first shape may further include rotationally symmetric shapes along one or more concentric outlines corresponding to features formed in a number of levels of exposure. The second shape may further include a cross-hatched grid of lines corresponding to features formed in the number of levels of exposure.

Figure 1:
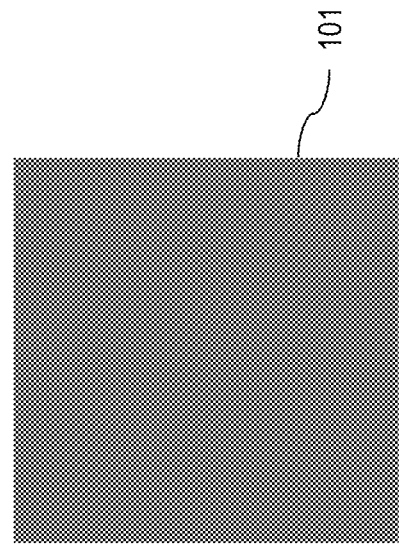
FIGS. 1 and 2 schematically illustrate a method for forming an alignment mark, in accordance with an exemplary embodiment.

Adverting to FIG. 1, a method for forming an alignment mark, according to an exemplary embodiment, begins with forming a first shape 101. The first shape 101 has rotational symmetry, such as by being 90-degree rotationally symmetric. Thus, although the first shape 101 is illustrated as a square, the first shape 101 can be any shape that is at least 90-degree rotationally symmetric, such as a circle, an octagon, a plus sign with equal length sides, etc.

Figure 2:
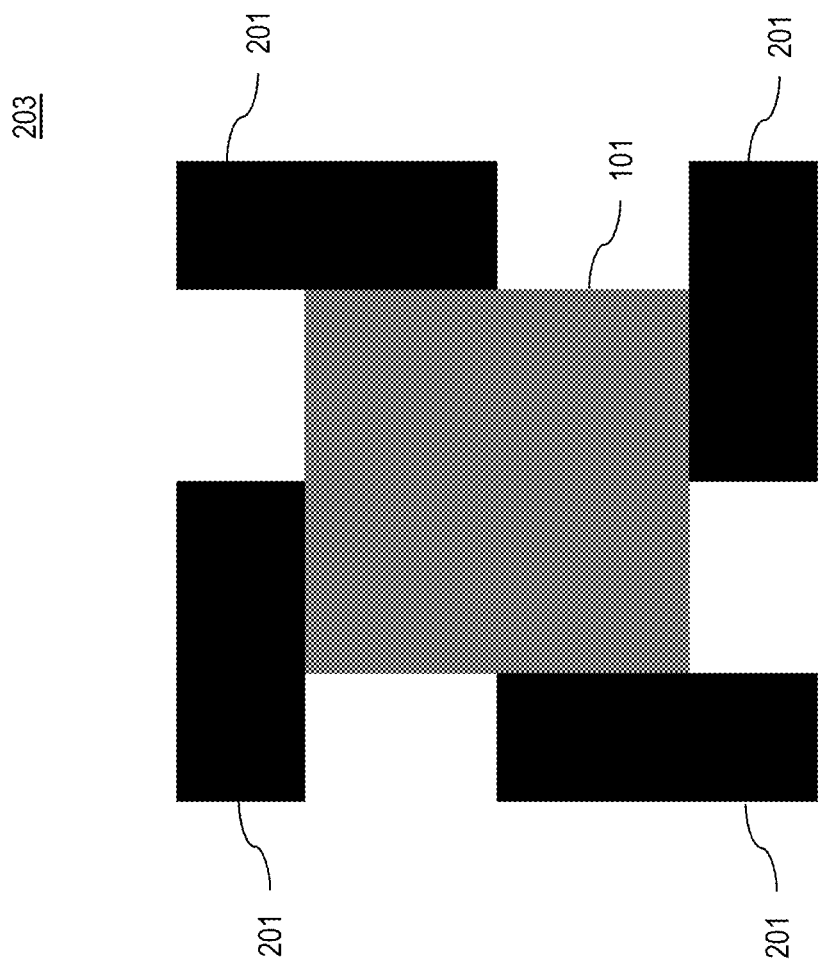

Adverting to FIG. 2, one or more of a second shape 201 are formed and combined with the first shape 101. As illustrated, four of the second shape 201 can be combined with the first shape 101. The second shape 201 is combined with the first shape 101 so that edges of the second shapes 201 are contiguous with separate edges of the first shape 101. Thus, as illustrated in FIG. 2, four of the second shape 201 are combined with the first shape 101 such that each second shape 201 is contiguous with a separate edge of the first shape 101. Further, the first shape 101 and the one or more of the second shape 201 are combined so that the resulting alignment mark 203 is rotationally symmetric, such as at least 90-degree rotationally symmetric. Although the alignment mark 203 is illustrated as including four of the second shape 201, one for each edge of the first shape 101, the number of second shapes 201 may be less than the number of edges of the first shape 101 as long as the resulting alignment mark is at least 90-degree rotationally symmetric. For example, a first shape in the form of an octagon may include only four of the second shape, one on every other edge, rather than eight (e.g., one for each side).

Figure 3B:
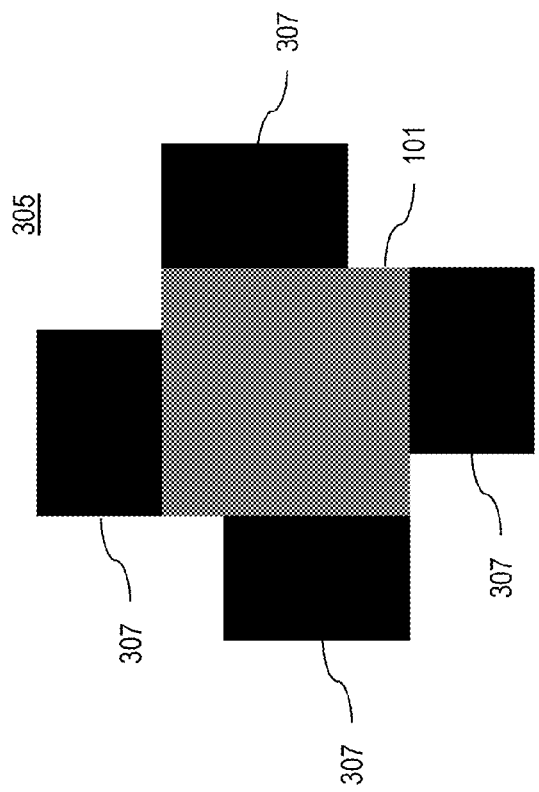
FIGS. 3A and 3B schematically illustrate additional alignment marks that may be formed based on the method illustrated in FIGS. 1 and 2, in accordance with exemplary embodiments.
Figure 3A:
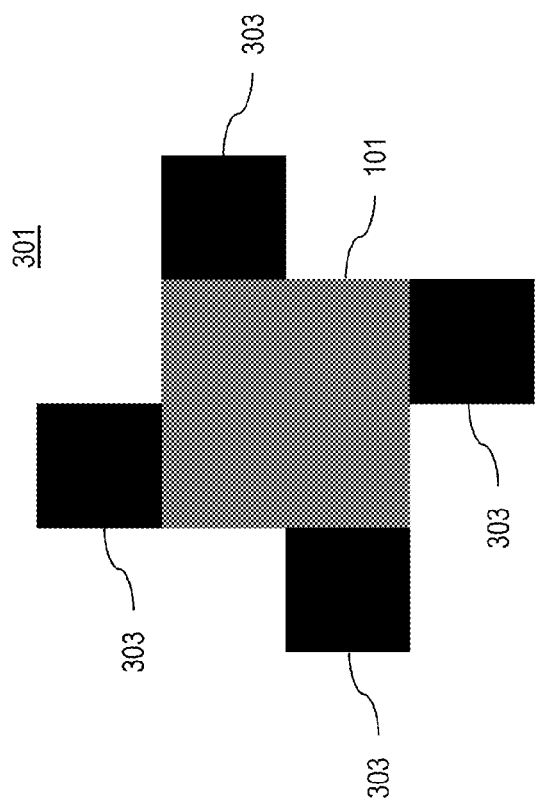

As illustrated in FIGS. 3A and 3B, the second shape can be various shapes, which do not need to be rotationally symmetric. Alignment mark 301 includes the first shape 101 and four of a second shape 303 in the form of a square. Alignment mark 305 includes the first shape 101 and four of a second shape 307 in the form of a rectangle. Although not shown (for illustrative convenience), the second shape can be other shapes, such as a triangle, a circle, a quadrilateral, etc., as long as the resulting alignment mark is at least 90-degree rotationally symmetric.

Figure 3C:
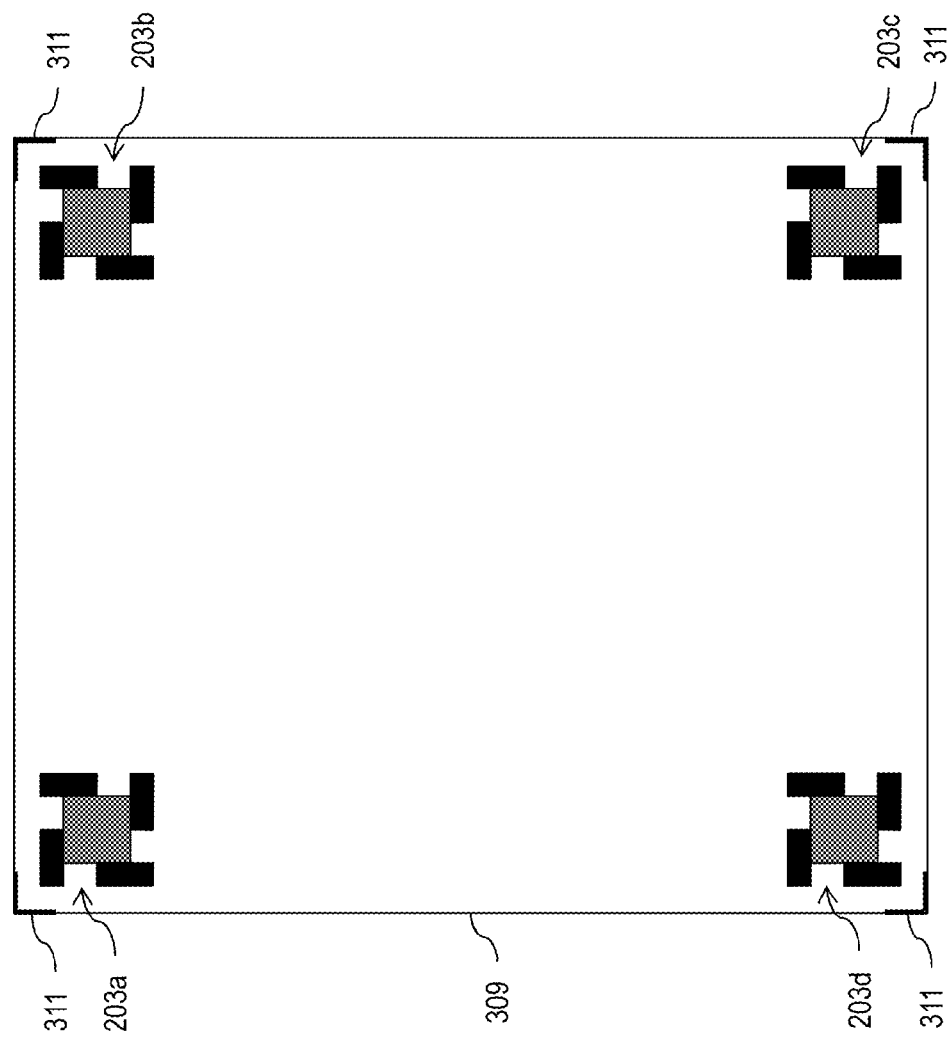
FIGS. 3C and 3D schematically illustrate alignment mark placement in four corners of a reticle field before and after a 90 degree rotation, in accordance with an exemplary embodiment.
Figure 3D:
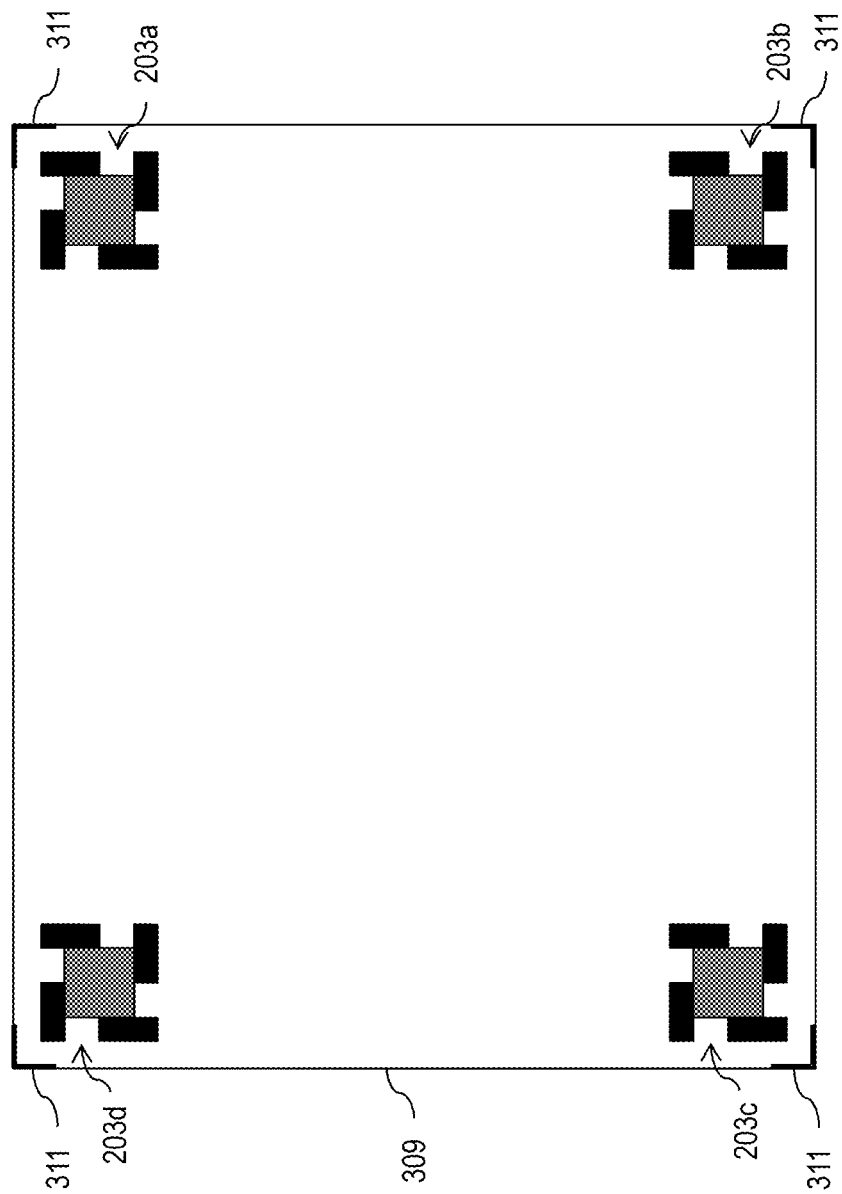
Figure 3E:
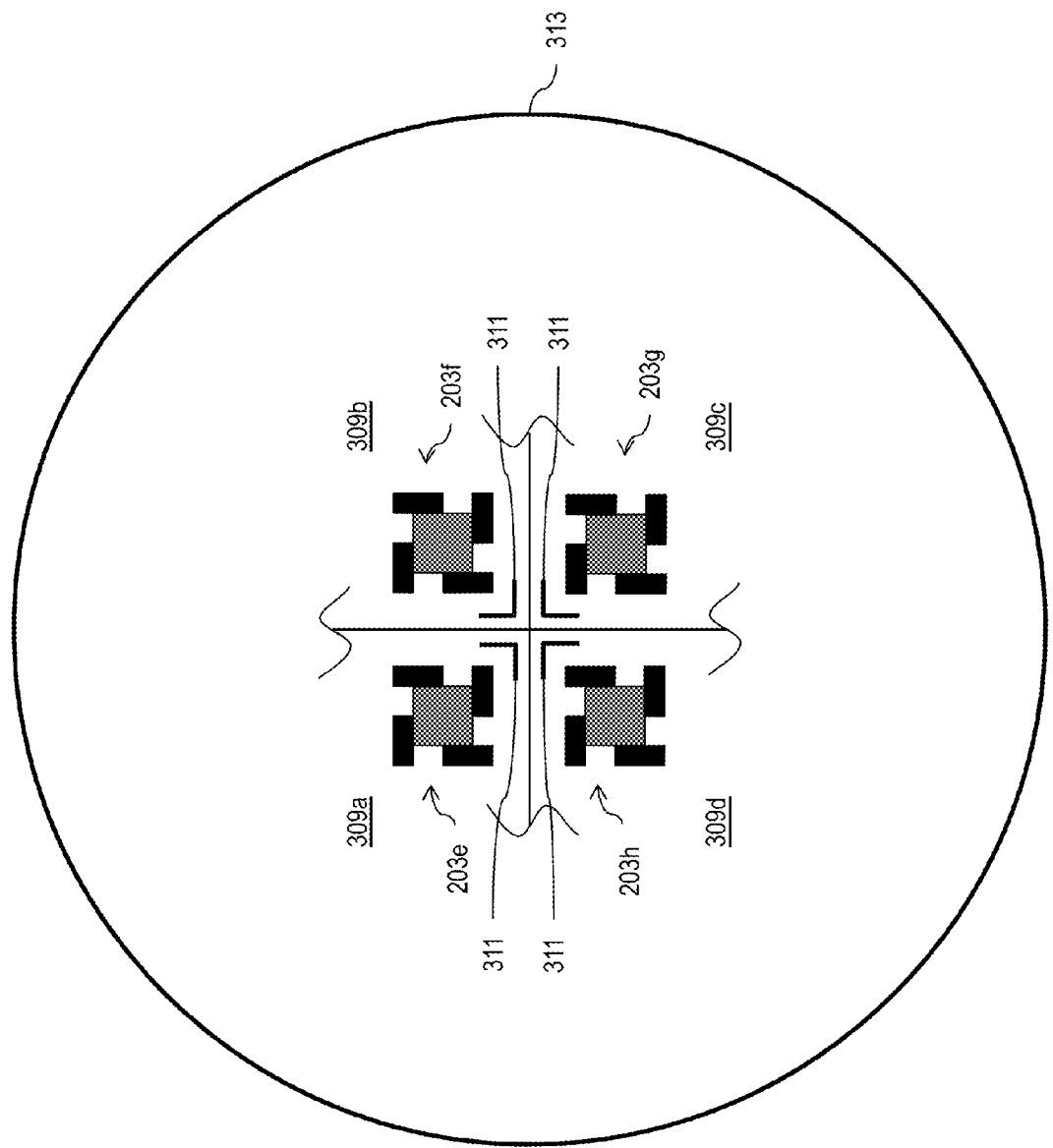
FIGS. 3E, 3G and 3I illustrate a wafer level including alignment marks, in accordance with exemplary embodiments.
Figure 3G:
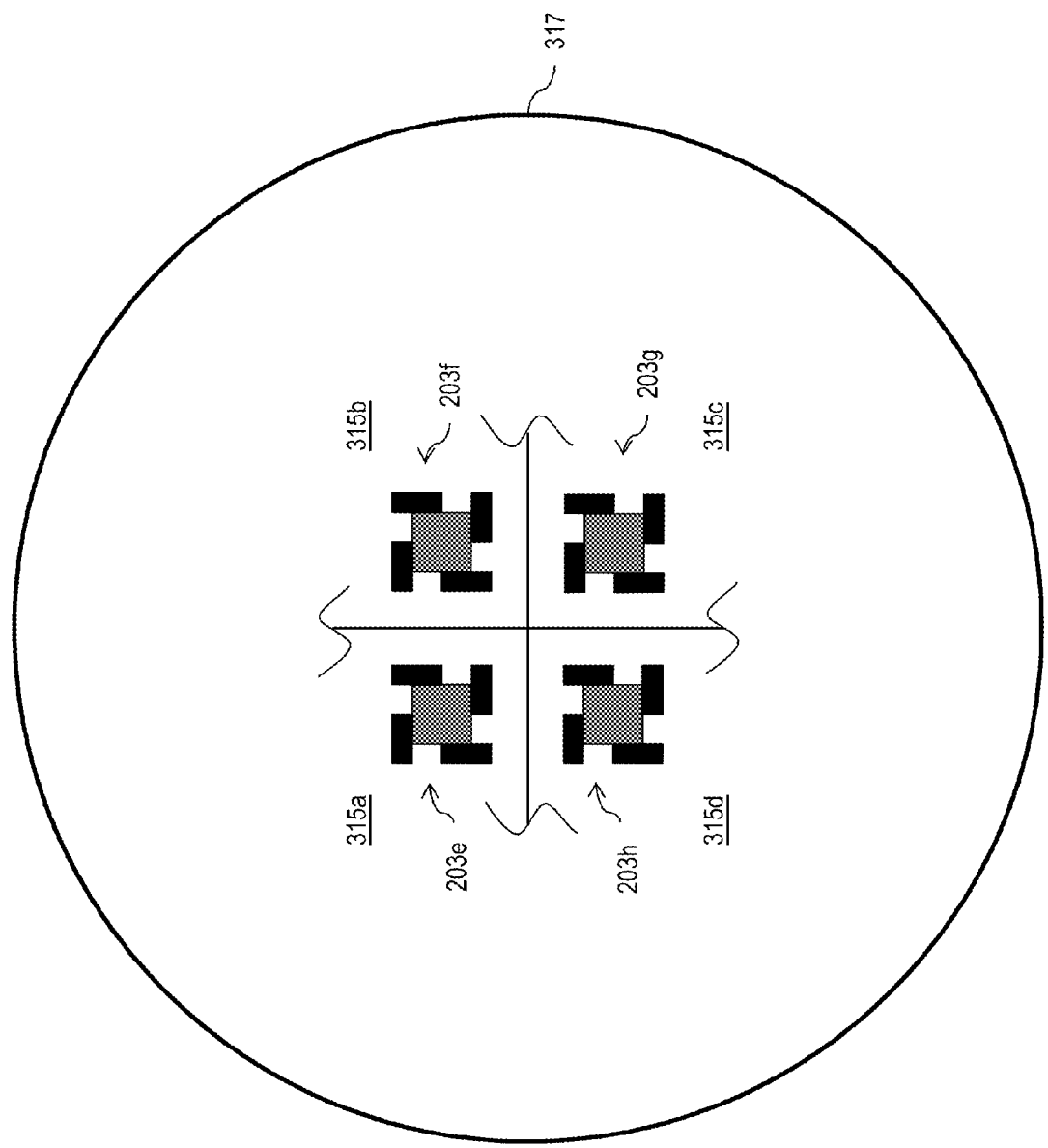
Figure 3H:
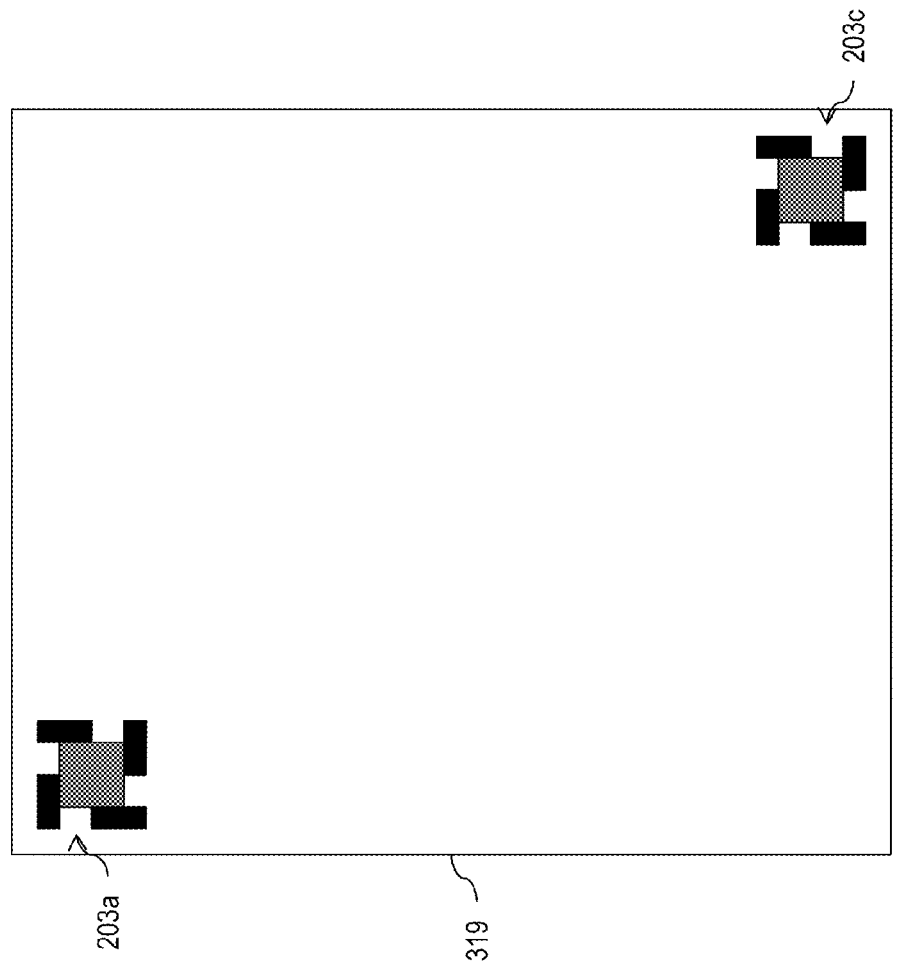
Figure 3I:
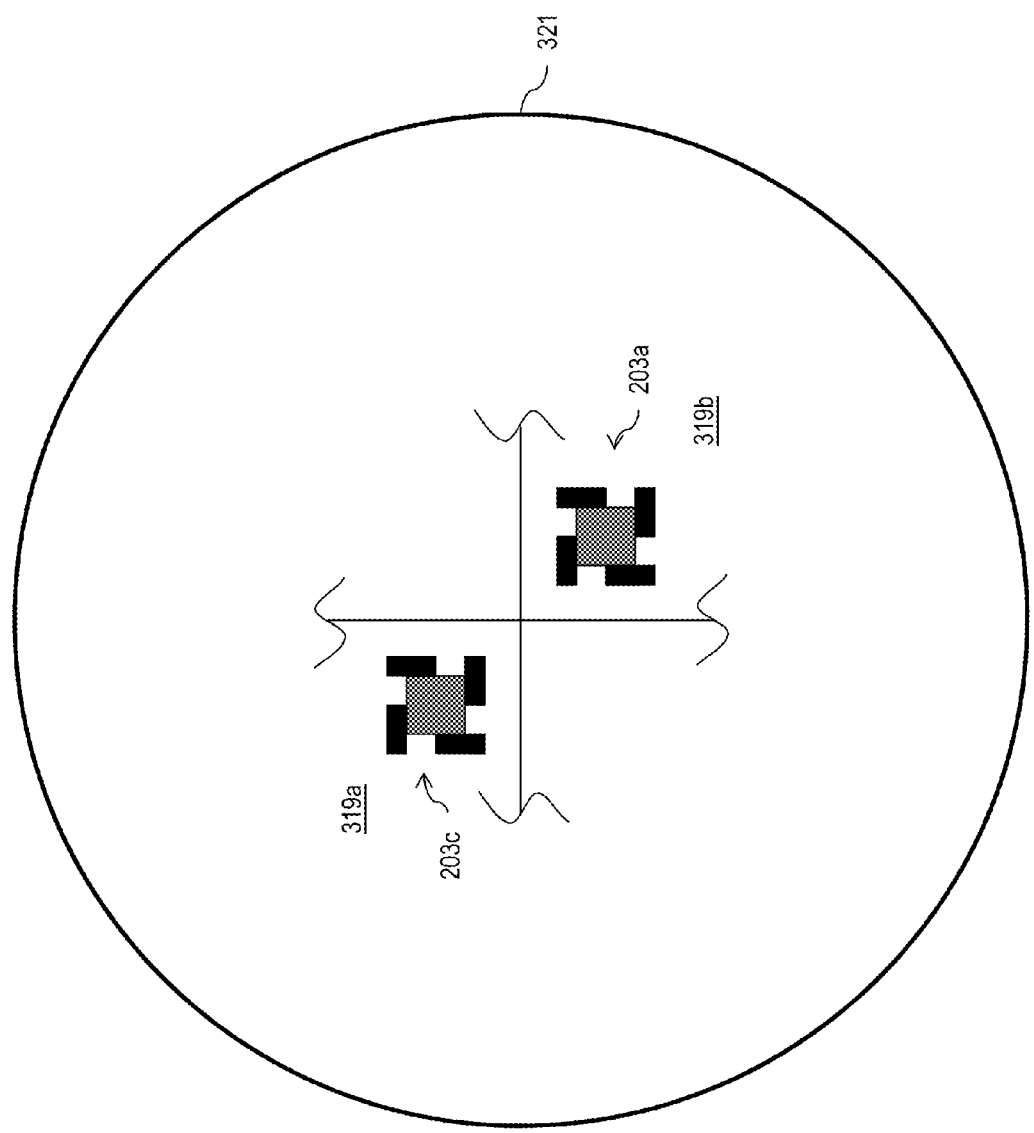

FIGS. 3C and 3D illustrate alignment marks 203a-203d in the four corners of a reticle field 309 before (FIG. 3C) and after (FIG. 3D) a 90-degree reticle inspection alignment. According to some layouts, the reticle field 309 may also include four frame or corner marks 311. Although the reticle field 309 is rotated 90 degrees clockwise from FIG. 3C to FIG. 3D, the alignment marks 203a-203d appear the same despite also having been rotated 90 degrees to the right, although the alignment marks 203a-203d remain in the same spots relative to before inspection. The alignment marks 203a-203d appear the same because the marks are rotationally symmetric at least about a 90-degree rotation. The optical alignment can, therefore, be the same for any n times of a 90-degree rotation. FIG. 3E illustrates a wafer level 313 that includes alignment marks 203e-203h (although not to scale) and corner marks 311 at corners of four reticle fields 309a-309d. Alignment marks 203e-203h as such allow for global optical setup for critical dimension scanning electronic microscope (CD-SEM) job files and metrology job files. FIG. 3F illustrates an alternative reticle field 315 with alignment marks 203a-203d where the reticle field 315 may not include corner marks illustrated in FIGS. 3C and 3D. Similarly, FIG. 3G illustrates a wafer level 317 that includes alignment marks 203e-203h (although not to scale) without corner marks at corners of four reticle fields 315a-315d. Thus, including the corner marks 311 may not be necessary based on different layouts. FIG. 3H illustrates the reticle field 319 including only two alignment marks 203a and 203c at the top left and bottom right corners. However, the two alignment marks 203a and 203c may alternatively be at the top right and bottom left corners (e.g., opposite corners). FIG. 3I illustrates a wafer level 321 including two reticle fields 319a and 319b having only two alignment marks 203a and 203c. The reticle field 319 and wafer level 321 may be for a different layout having 100% exposure for different reticle overlapping.

For 20 nm and below technology nodes, there are two or more layers of poly and active layers. Further, contact, vertical interconnect access (VIA) and metal layers may use double or triple patterning. Thus, it is important to monitor the overlay of the double patterning. Further, because both size and overlay of implant layers is important for 28 nm nodes and below, it is also important to monitor the overlay for implant layers. Thus, FIGS. 4A through 5K illustrate forming additional detail in the alignment marks discussed above that can be used for forming front-end-of-line (FEOL) and/or middle-of-line (MOL) features in semiconductor devices, using alignment mark 301 as an example. However, the discussion below can be applied to other alignment marks discussed above.

Figure 4A:
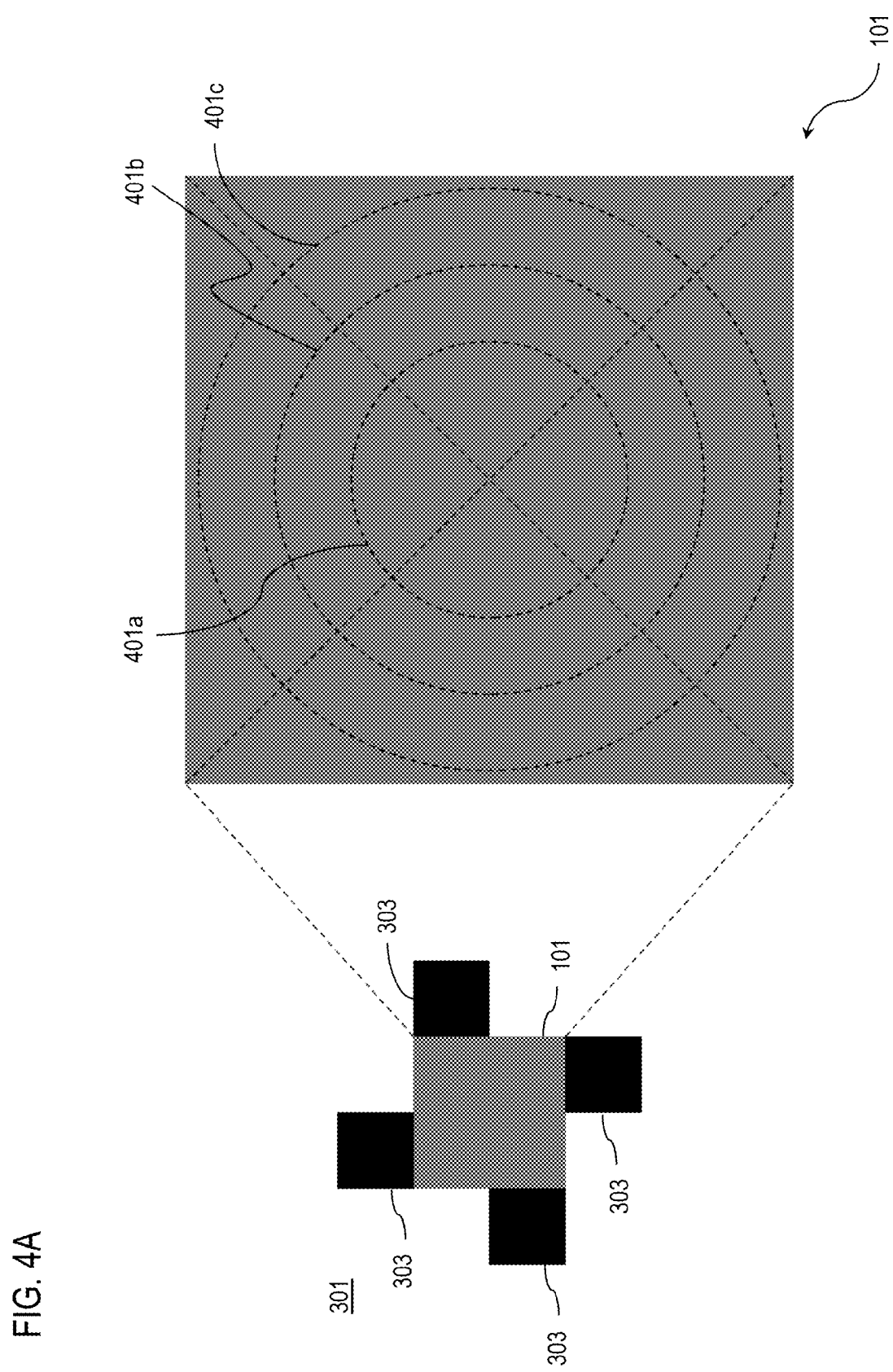
FIGS. 4A through 5L illustrate a method for forming a first shape of an alignment mark, in accordance with an exemplary embodiment.

Adverting to FIG. 4A, the first shape 101 may include additional detail. For example, the first shape 101 may include one or more concentric circles. As illustrated, the first shape 101 includes three concentric circles 401a-401c. Although only three concentric circles are illustrated, the first shape 101 may include additional concentric circles that may correspond to additional exposure layouts (e.g., triple exposure layout, etc.).

Figure 4B:
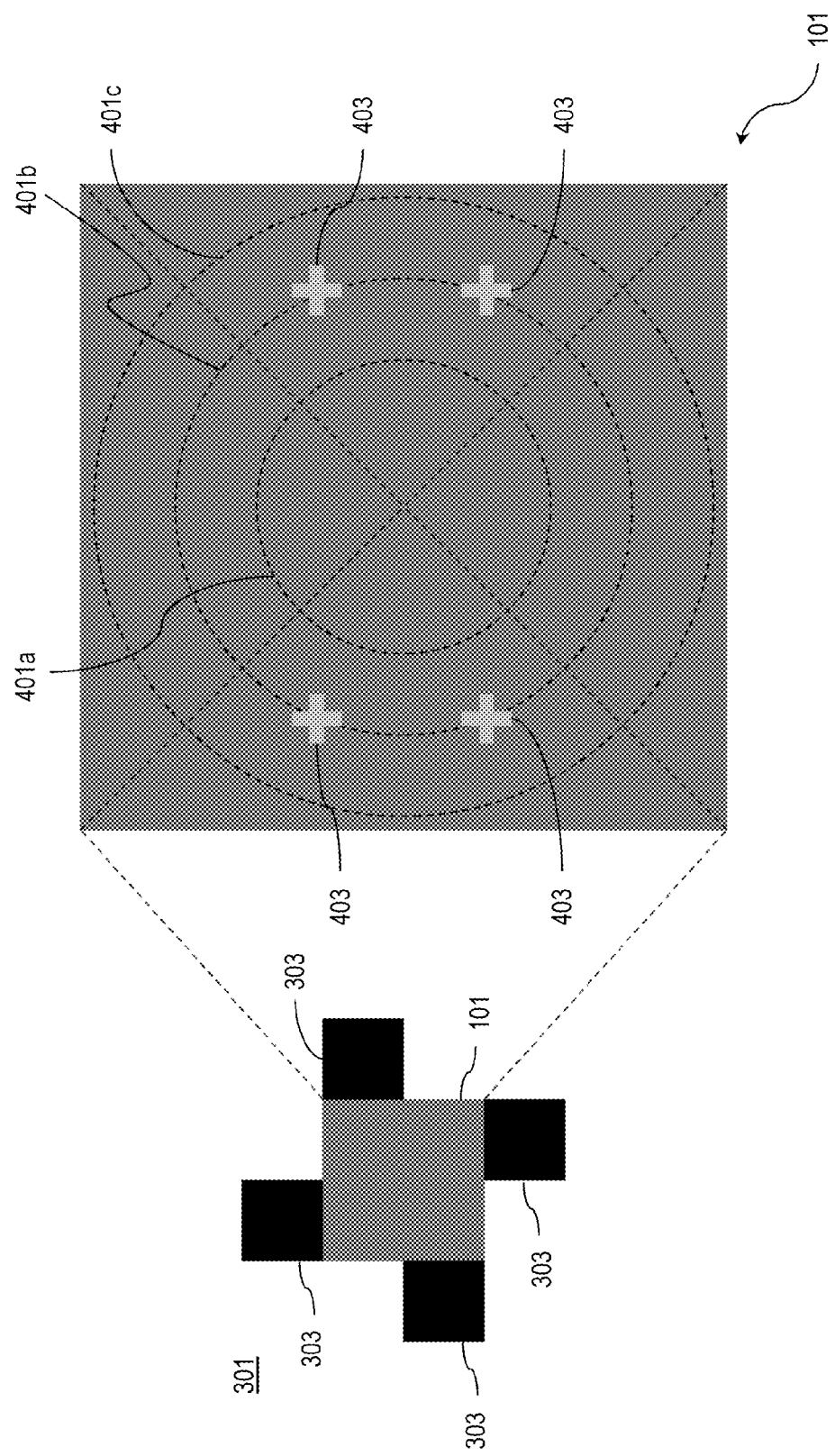

Next, implant layer marks 403 are added to the first shape 101, as illustrated in FIG. 4B. The implant layer marks 403 correspond to a step for forming an implant layer. Although the implant layer marks 403 are illustrated as plus signs, the implant layer marks 403 may be any shape. Alternatively, the implant layer marks 403 may be any shape that is 90-degree rotationally symmetric. Further, the specific locations of the implant layer marks 403 are not fixed such that the implant layer marks 403 may be at any location within the first shape 101 along one or more of the concentric circles 401a-401c. Alternatively, the implant layer marks 403 may be located within the first shape 101 along one or more of the concentric circles 401a-401c such that the first shape 101, including the implant layer marks 403, is 90-degree rotationally symmetric.

Subsequently, first active layer marks 405 are added to the first shape 101, as illustrated in FIG. 4C. The first active layer marks 405 correspond to a step for forming a first active layer. Although the first active layer marks 405 are illustrated as plus signs of various sizes, the first active layer marks 405 may be any shape and/or size. Alternatively, the first active layer marks 405 may be any shape that is 90-degree rotationally symmetric. Further, the specific locations of the first active layer marks 405 are not fixed such that the first active layer marks 405 may be at any location within the first shape 101 along one or more of the concentric circles 401a-401c.

Figure 4D:
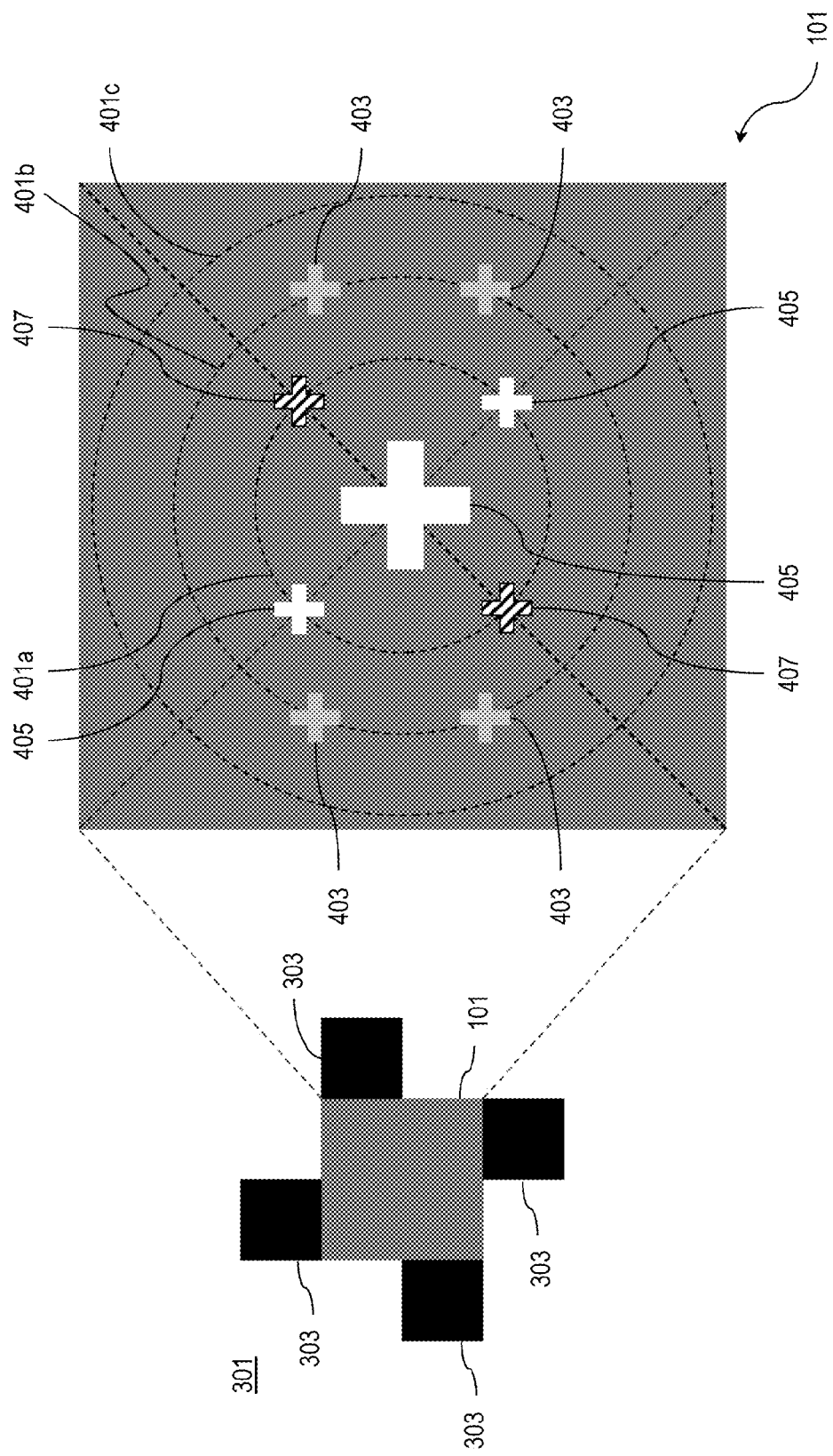

Next, second active layer marks 407 are added to the first shape 101, as illustrated in FIG. 4D. The second active layer marks 407 correspond to a step for forming a second active layer. Although the second active layer marks 407 are illustrated as plus signs, the second active layer marks 407 may be any shape and/or size. Alternatively, the second active layer marks 407 may be any shape that is 90-degree rotationally symmetric. Further, the specific locations of the second active layer marks 407 are not fixed such that the second active layer marks 407 may be at any location within the first shape 101 along one or more of the concentric circles 401a-401c.

Figure 4E:
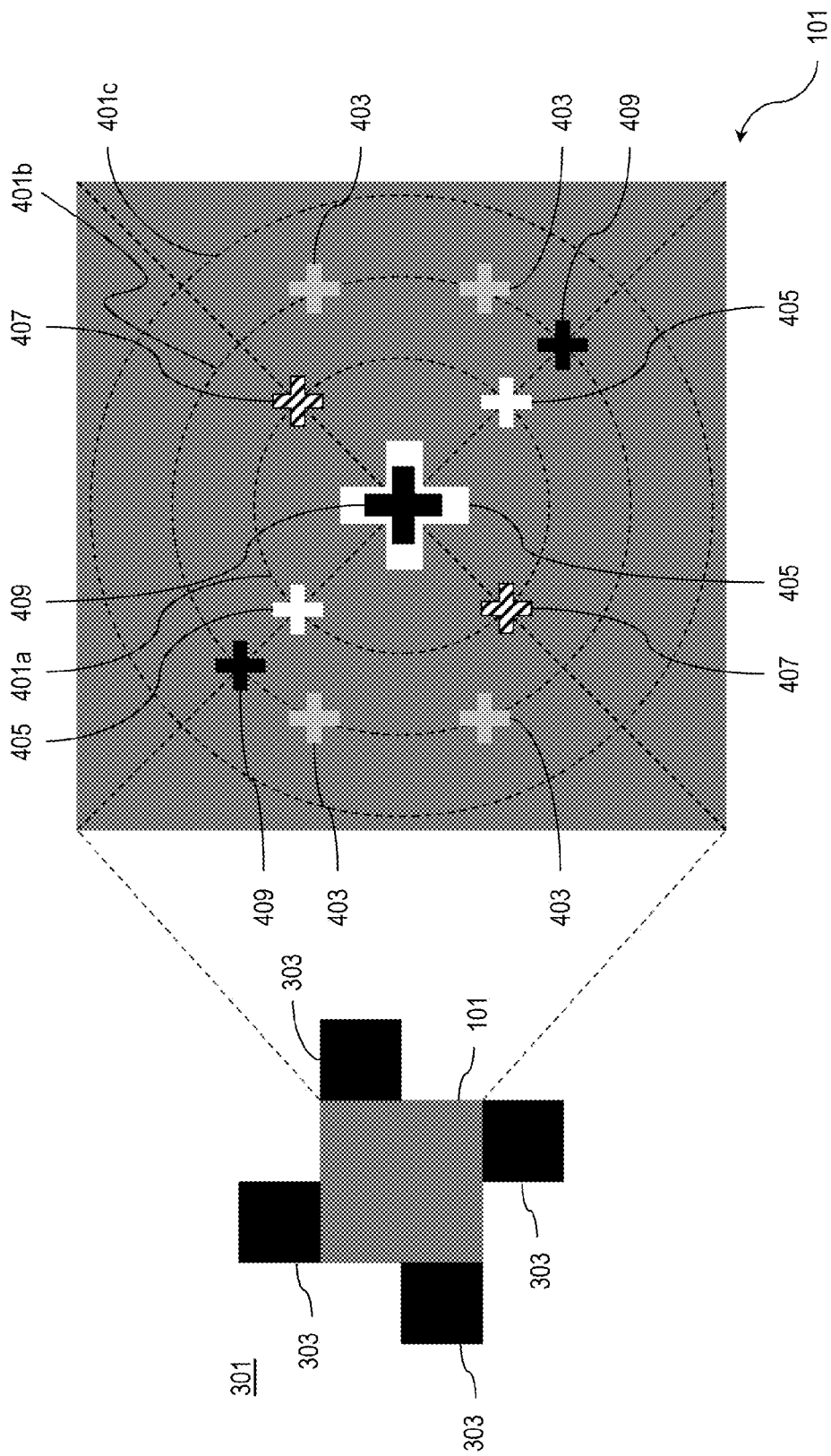

Poly layer marks 409 are then added to the first shape 101, as illustrated in FIG. 4E. The poly layer marks 409 correspond to a step for forming a poly layer. Although the poly layer marks 409 are illustrated as plus signs, the poly layer marks 409 may be any shape. Alternatively, the poly layer marks 409 may be any shape that is 90-degree rotationally symmetric. Further, the specific locations of the poly layer marks 409 are not fixed such that the poly layer marks 409 may be at any location within the first shape 101 along one or more of the concentric circles 401a-401c.

Figure 4F:
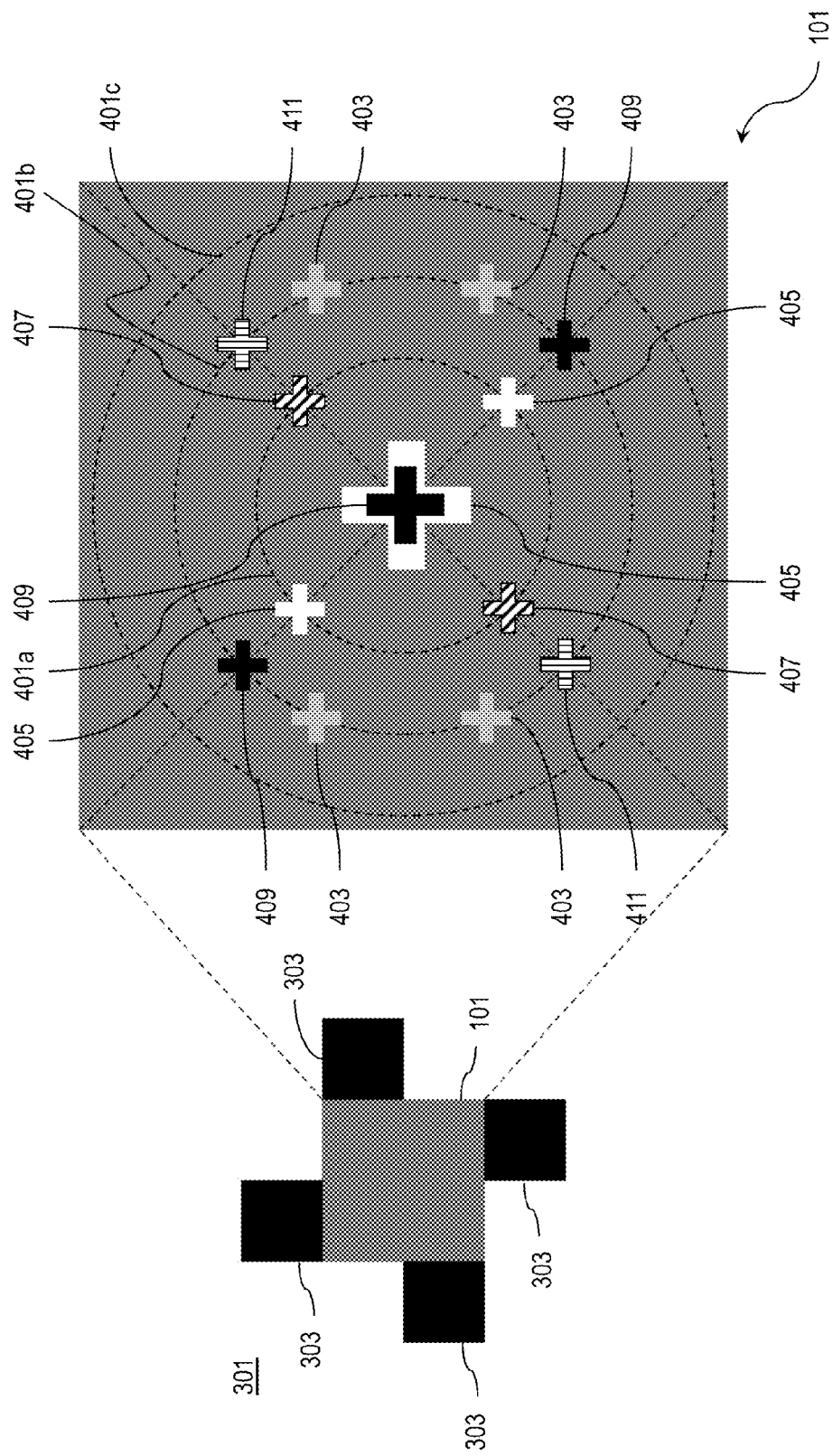

Next, cut layer marks 411 are added to the first shape 101, as illustrated in FIG. 4F. The cut layer marks 411 correspond to a step for a cut layer. Although the cut layer marks 411 are illustrated as plus signs, the cut layer marks 411 may be any shape. Alternatively, the cut layer marks 411 may be any shape that is 90-degree rotationally symmetric. Further, the specific locations of the cut layer marks 411 are not fixed such that the cut layer marks 411 may be at any location within the first shape 101 along one or more of the concentric circles 401a-401c.

Then, first contact layer marks 413 are added to the first shape 101, as illustrated in FIG. 4G. The first contact layer marks 413 correspond to a step for a first contact layer. Although the first contact layer marks 413 are illustrated as squares, the first contact layer marks 413 may be any shape. Alternatively, the first contact layer marks 413 may be any shape that is 90-degree rotationally symmetric. Further, the specific locations of the first contact layer marks 413 are not fixed such that the first contact layer marks 413 may be at any location within the first shape 101 along one or more of the concentric circles 401a-401c.

Figure 4H:
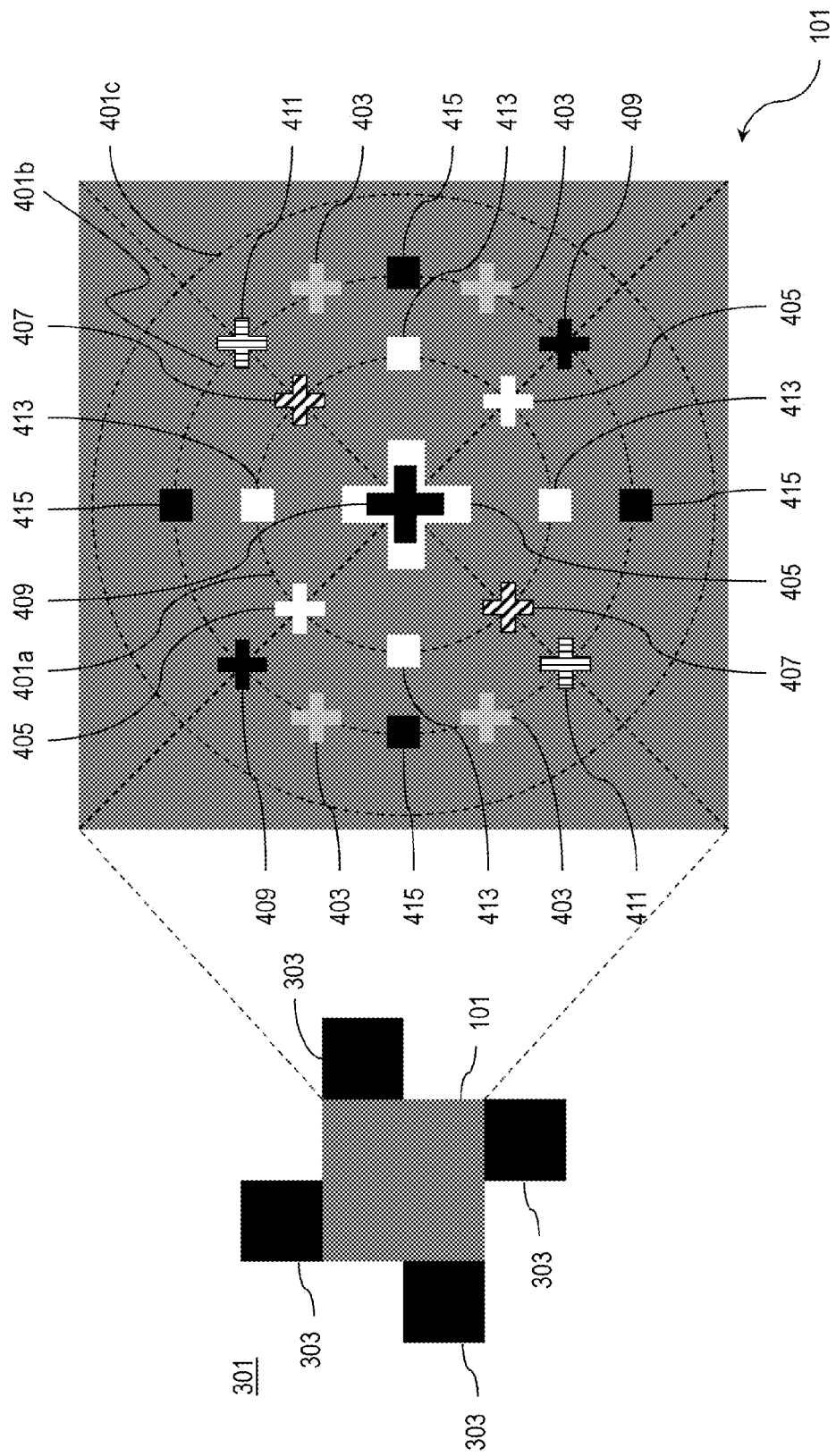

Finally, second contact layer marks 415 are added to the first shape 101, as illustrated in FIG. 4H. The contact layer marks 415 correspond to a step for a second contact layer. Although the contact layer marks 415 are illustrated as squares, the second contact layer marks 415 may be any shape. Alternatively, the contact layer marks 415 may be any shape that is 90-degree rotationally symmetric. Further, the specific locations of the second contact layer marks 415 are not fixed such that the second contact layer marks 415 may be at any location within the first shape 101 along one or more of the concentric circles 401a-401c. The result is a first shape 101 in an alignment mark 301 that can be used for alignment while forming FEOL features of semiconductors devices.

Adverting to FIG. 5A, the second shape 303 may also include additional detail for specific steps within FEOL and/or MOL process flows. For example, the second shape 301 may include a hashed pattern that is made up of lines and/or circles representing steps in FEOL process flow. The hashed pattern may be formed according to the following.

Vertical lines 501 are added to the second shape 303, as illustrated in FIG. 5A. The vertical lines 501 correspond to the formation of a first active layer. Although there are three vertical lines 501, at the left edge, center and right edge of the second shape 303, the number, size and location of the vertical lines 501 may vary.

Figure 5C:
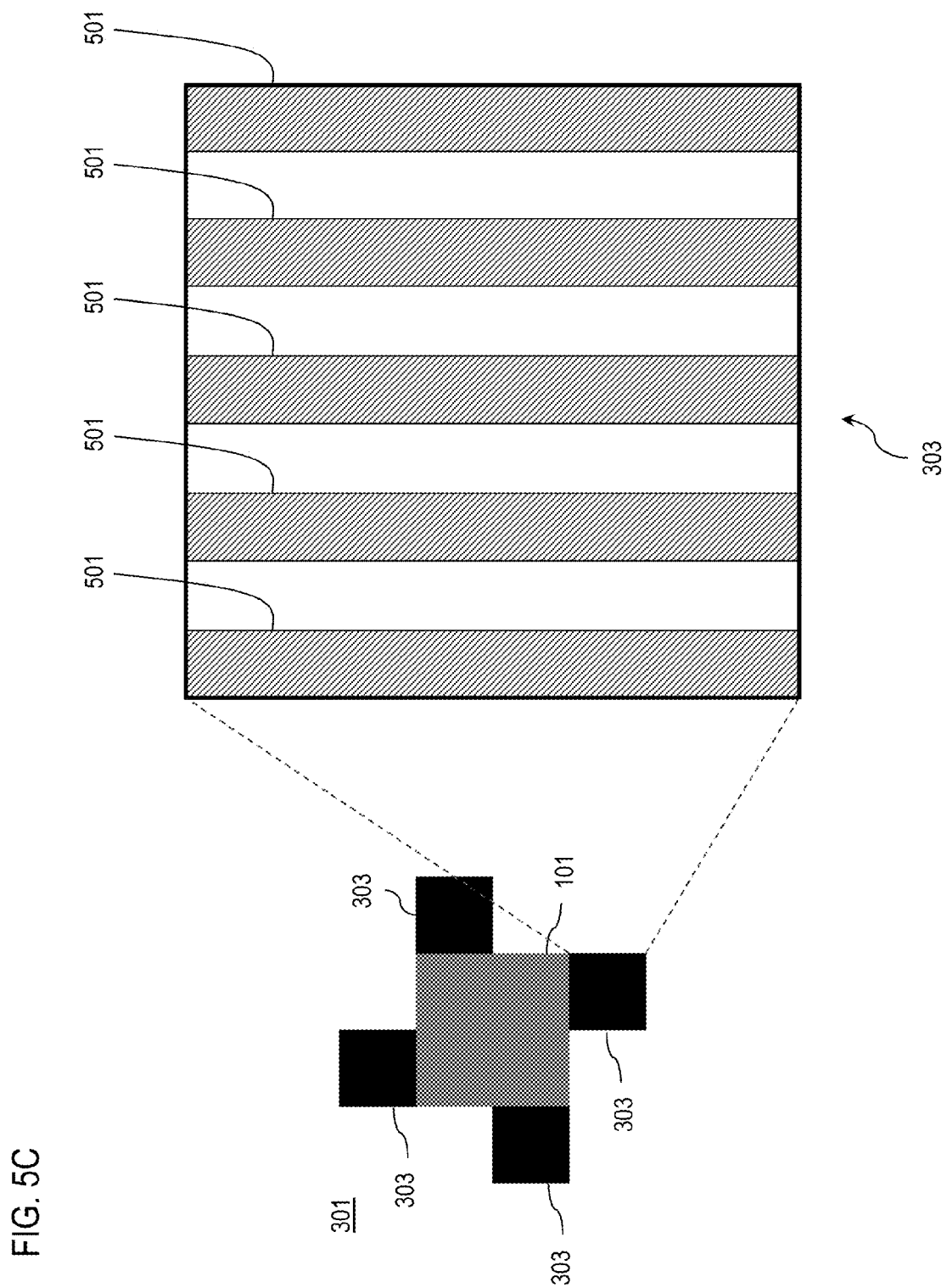

Next, vertical lines 503 are added to the second shape 303, as illustrated in FIG. 5B. The vertical lines 503 correspond to the formation of a second active layer. Although there are two vertical lines 503 at the left center and right center of the second shape 303, the number, size and location of the vertical lines 503 may vary. Alternatively, as illustrated in FIG. 5C, the second shape 303 may instead include five vertical lines 501 that correspond to the formation of the first active layer and a poly layer, rather than the vertical lines 501 and vertical lines 503 corresponding to the first and second active layers, respectively.

Figure 5D:
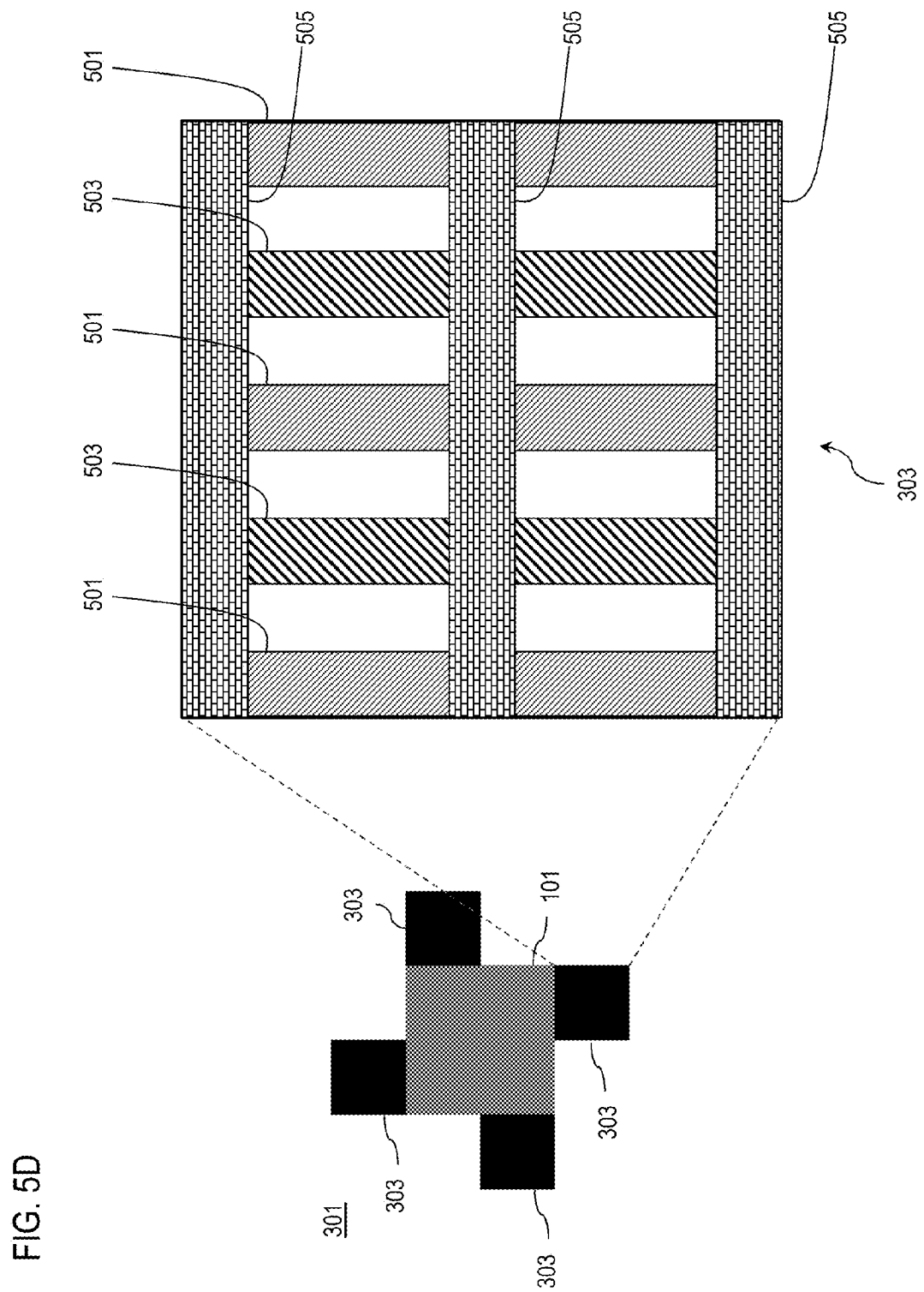

After forming the vertical lines 503, horizontal lines 505 are then added to the second shape 303, as illustrated in FIG. 5D. The horizontal lines 505 correspond to the formation of a poly layer. Although there are three horizontal lines 505, at the top, center and bottom of the second shape 303, the number, size and location of the horizontal lines 505 may vary.

Figure 5E:
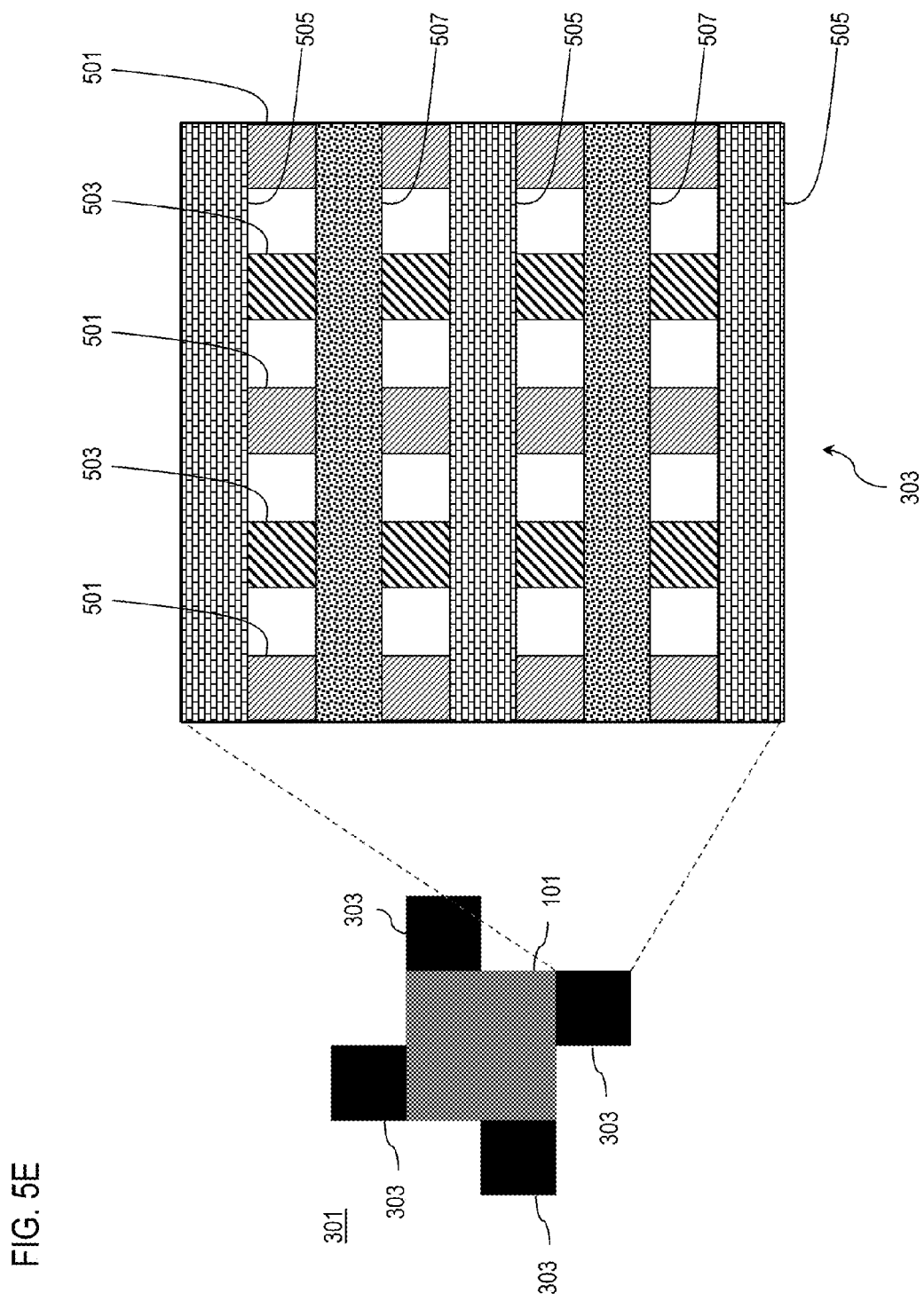
Figure 5F:
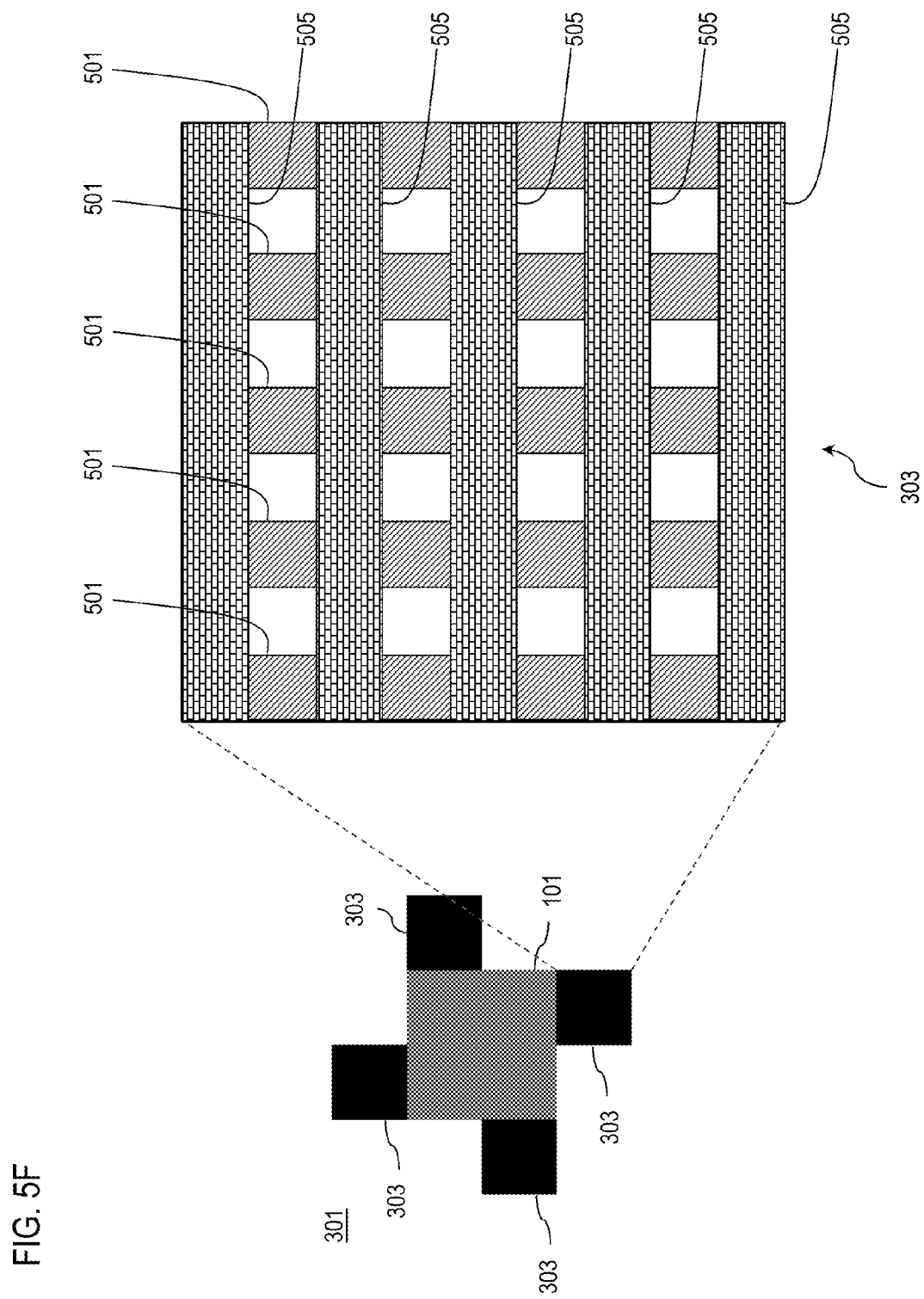

Subsequently, horizontal lines 507 are added to the second shape 303, as illustrated in FIG. 5E. The horizontal lines 507 correspond to the formation of a cut layer. Although there are two horizontal lines 507, at the middle top and middle bottom of the second shape 303, the number, size and location of the horizontal lines 507 may vary. Alternatively, as illustrated in FIG. 5F, the second shape may instead include five horizontal lines 505 that correspond to the formation of the second active layer and a poly cut layer, rather than the horizontal lines 505 and horizontal lines 507 corresponding to the poly layer and the cut layer, respectively.

Figure 5G:
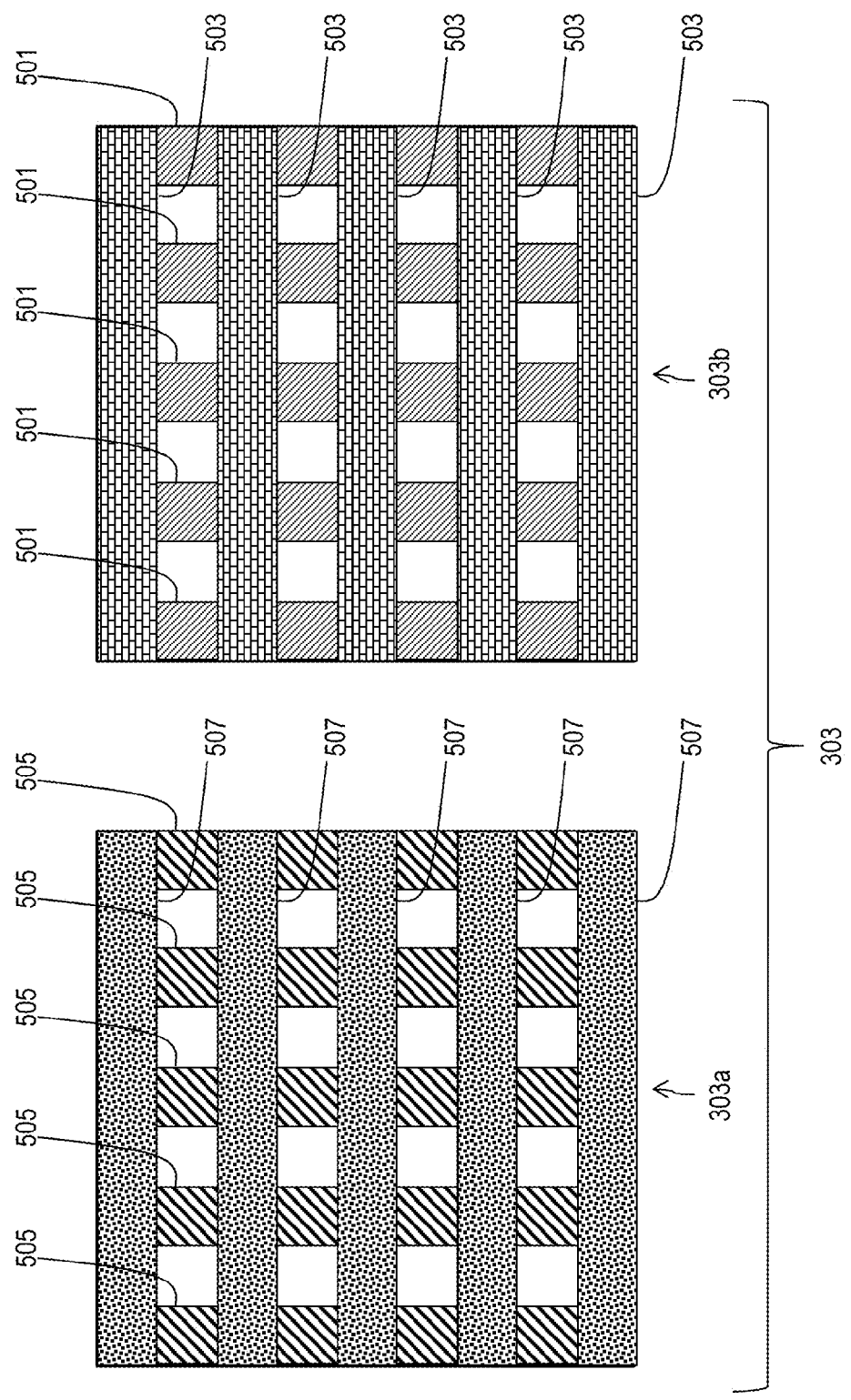

Moreover, as illustrated in FIG. 5G, the second shape 303 may include overlapping vertical and horizontal layers, such as layer 303a that overlaps above layer 303b of the second shape 303. Layer 303b may include vertical lines 501 corresponding to the formation of a first active layer and horizontal lines 503 corresponding to the formation of a second active layer. Further, layer 303a above layer 303b may include vertical lines 505 corresponding to the formation of a poly layer and horizontal lines 507 corresponding to the formation of a poly cut layer. Thus, vertical lines 505 overlap vertical lines 501, and horizontal lines 507 overlap horizontal lines 503. Of course, the number, size and location of the vertical lines 501 and 505 and the horizontal line 503 and 507 may vary.

Figure 5H:
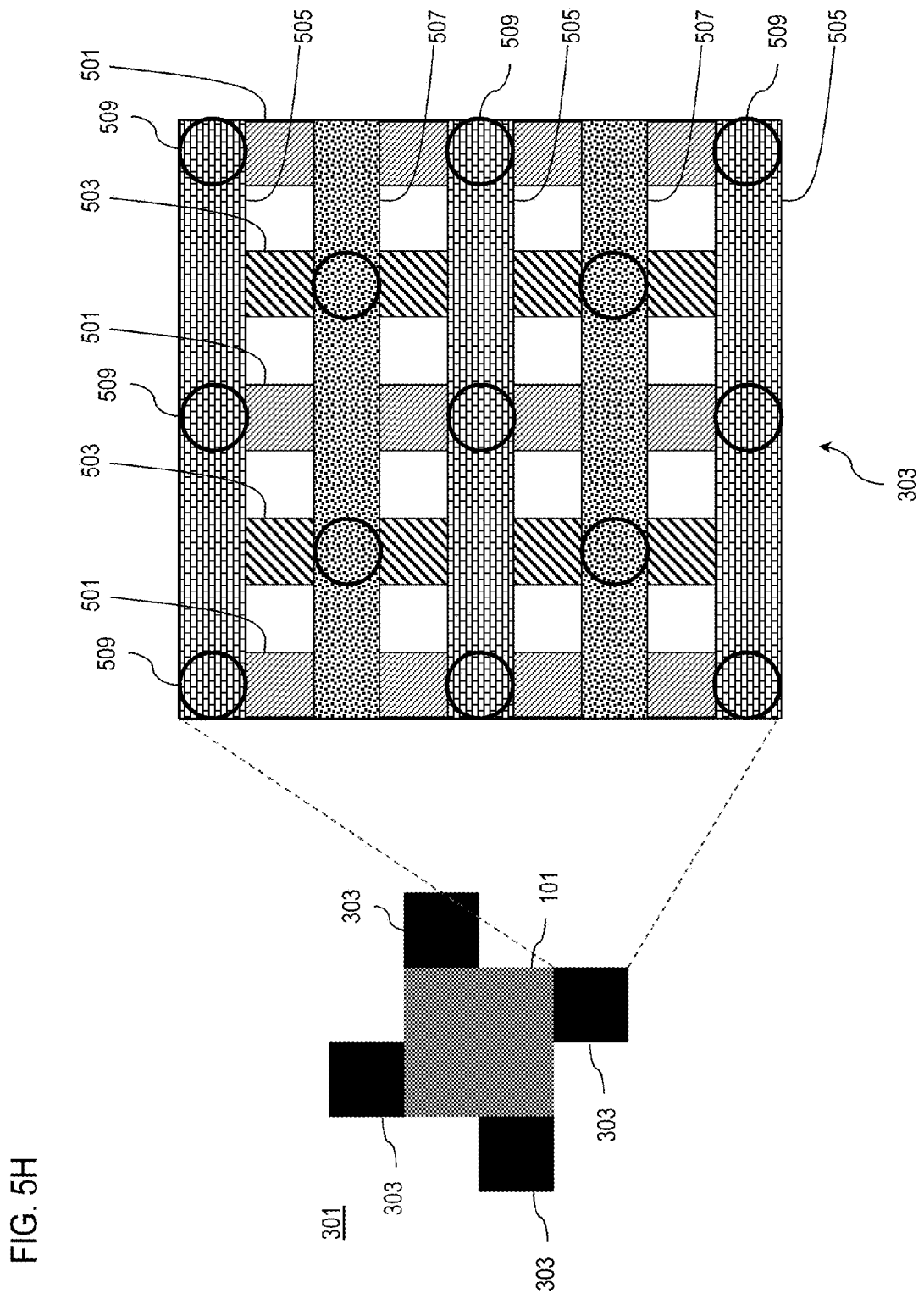

After forming the horizontal lines 507, circles 509 are added to the second shape 303, as illustrated in FIG. 5H. The circles 509 correspond to the formation of a first contact layer. The circles 509 may be formed at intersections of the vertical lines 501 and the horizontal lines 505, as well as at the intersections of the vertical lines 503 and the horizontal lines 507. However, the number, size, shape and location of the circles 509 may vary.

Figure 5I:
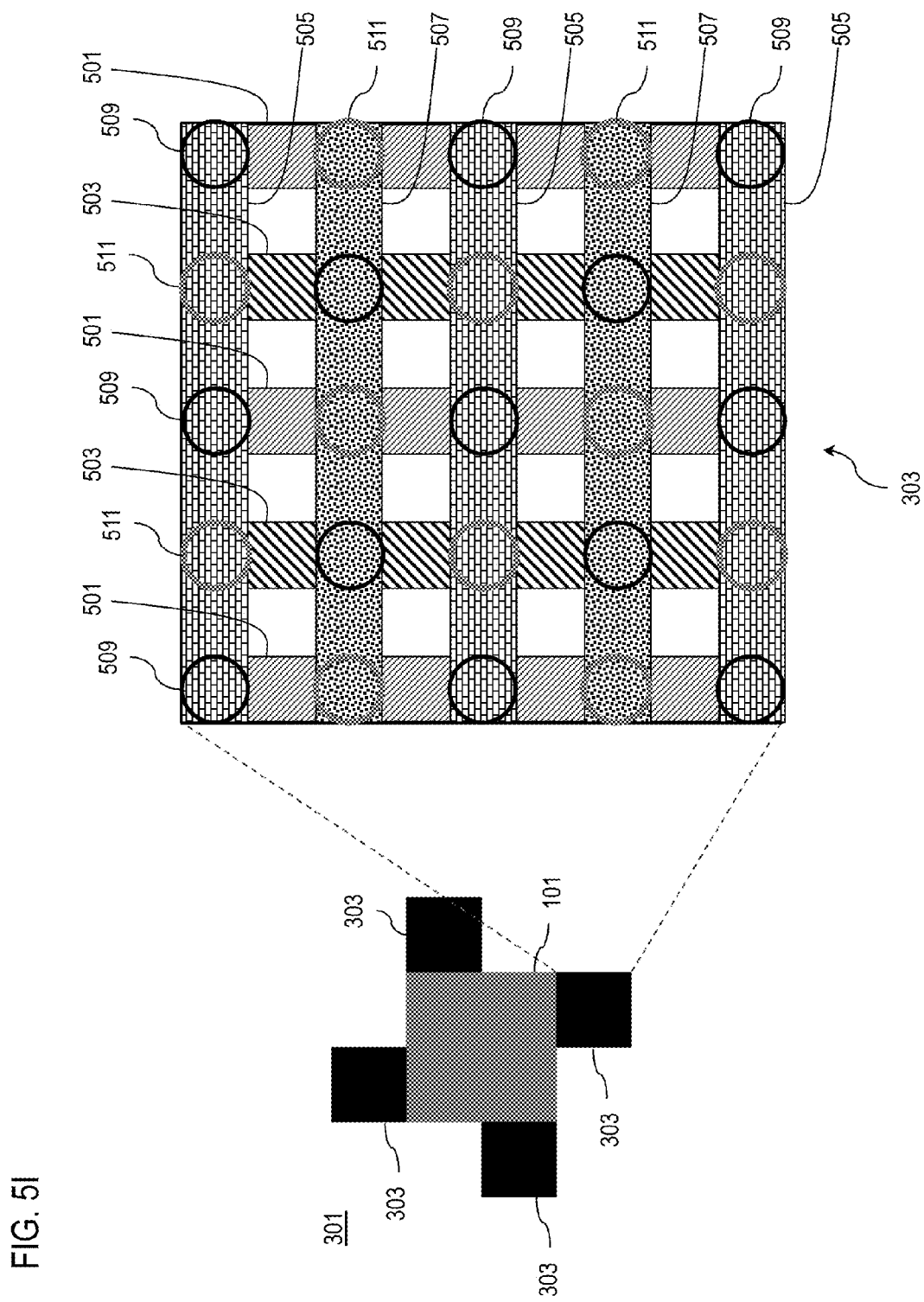

Circles 511 are also added to the second shape 303, as illustrated in FIG. 5I. The circles 511 correspond to the formation of a second contact layer. The circles 511 may be formed at intersections of the vertical lines 503 and the horizontal lines 505, as well as at the intersections of the vertical lines 501 and the horizontal lines 507. However, the number, size, shape and location of the circles 511 may vary.

Figure 5K:
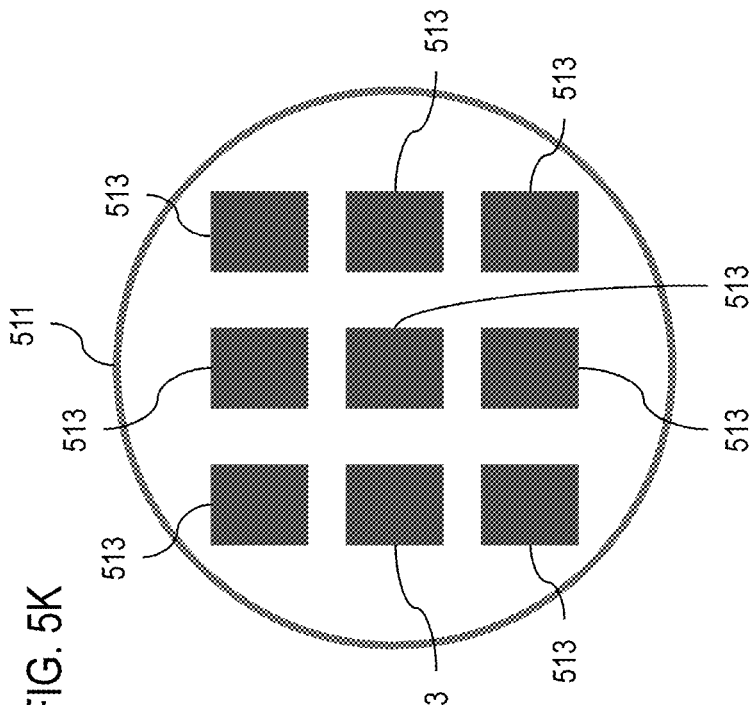
Figure 5J:
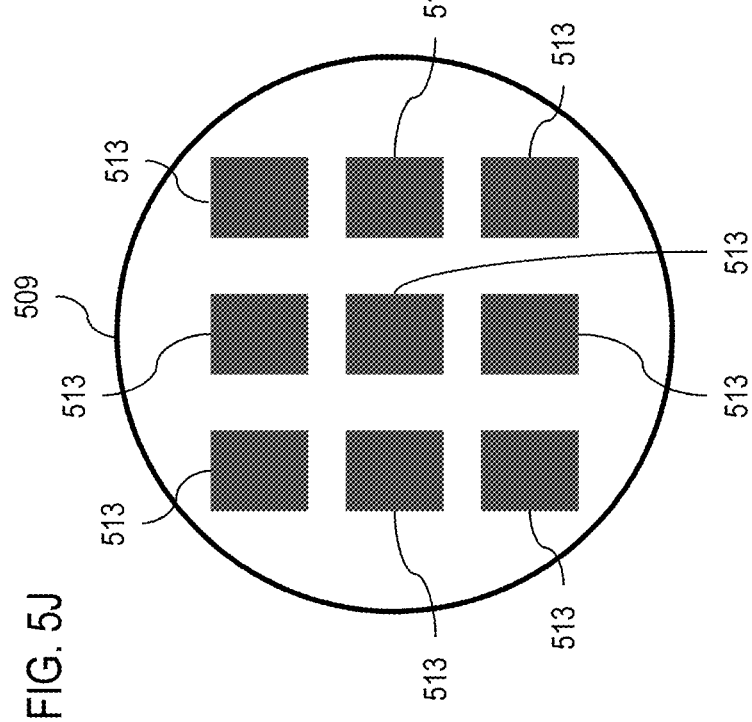

FIGS. 5J and 5K illustrate that the circles 509 and 511 may be formed to include features 513 that correspond to contacts formed in the semiconductor devices. Although nine features 513 are illustrated in a 3×3 pattern, the number and shape of the features 513 may vary, such as the circles 509 and 511 including only one feature (e.g., 1×1) or more than nine features (e.g., 5×5). As the number of features 513 included within the circles 509 and 511 increases, the size of the features 513 decreases. Further, the number of features 513 within the circles 509 and 511 may correspond to a size of the contacts such that a larger number of features 513 corresponds to smaller contacts.

Figure 5L:
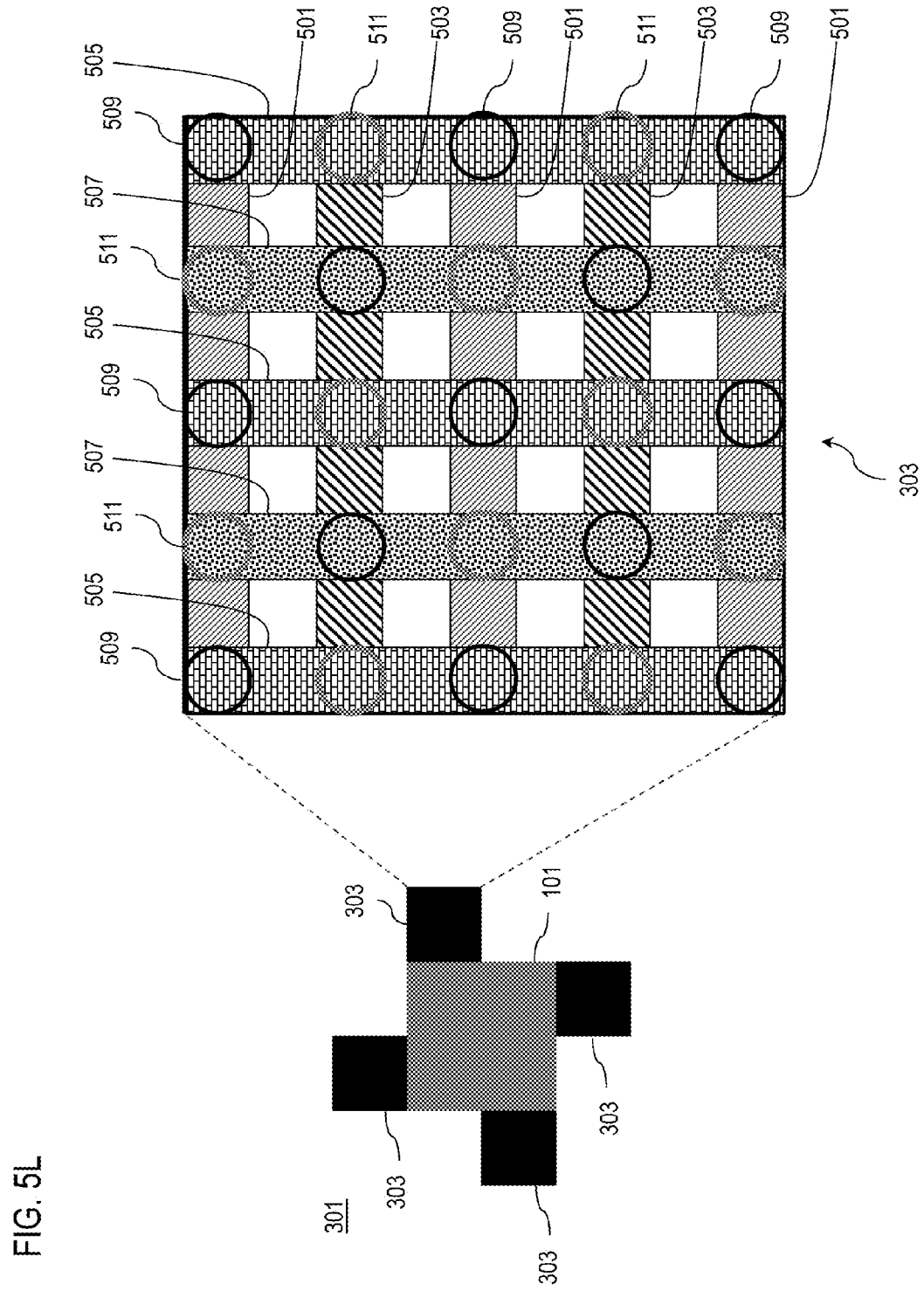

The result is a second shape 303 in an alignment mark 301 that can be used for alignment while forming FEOL and/or MOL features of semiconductor devices. Further, the result is a second shape 303 that is not rotationally symmetric, as illustrated in FIG. 5L, which shows a 90-degree clockwise rotated version of the second shape 303 in FIG. 5I.

FIGS. 6A through 7I illustrate forming details in a first shape 603 and a second shape 605 for an alignment mark 601 for back-end-of-line (BEOL) features, such as forming the horizontal and vertical metal line overlap areas. Adverting to FIG. 6A, the first shape 603 may include additional detail. For example, the first shape 603 may include one or more concentric circles. As illustrated, the first shape 603 includes three concentric circles 607a-607c. Although only three concentric circles are illustrated, the first shape 603 may include additional concentric circles that correspond to additional exposure layouts (e.g., triple exposure layout).

Next, first metal layer marks 609 are added to the first shape 603, as illustrated in FIG. 6B. The first metal layer marks 609 correspond to a step for forming a first metal layer. Although the first metal layer marks 609 are illustrated as plus signs of various sizes, the first metal layer marks 609 may be any shape. Alternatively, the first metal layer marks 609 may be any shape that is 90-degree rotationally symmetric. Further, the specific locations of the first metal layer marks 609 are not fixed such that the first metal layer marks 609 may be at any location within the first shape 603 along one or more of the concentric circles 607a-607c. Alternatively, the first metal layer marks 609 may be located within the first shape 603 along one or more of the concentric circles 607a-607c such that the first shape 603, including the first metal layer marks 609, is 90-degree rotationally symmetric.

Figure 6A:
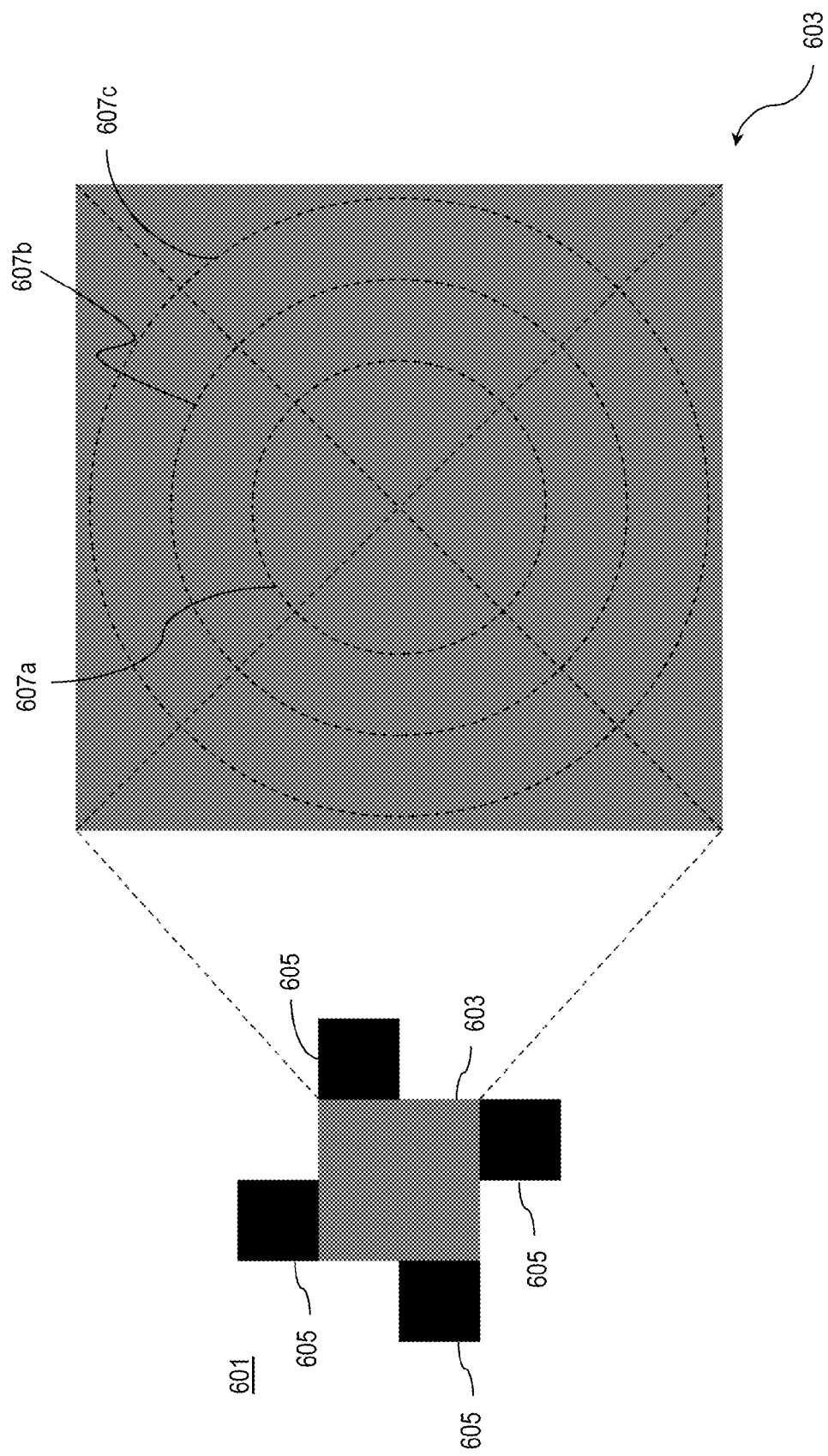
FIGS. 6A through 7I illustrate a method for forming a first shape of an alignment mark, in accordance with an alternative exemplary embodiment.
Figure 6C:
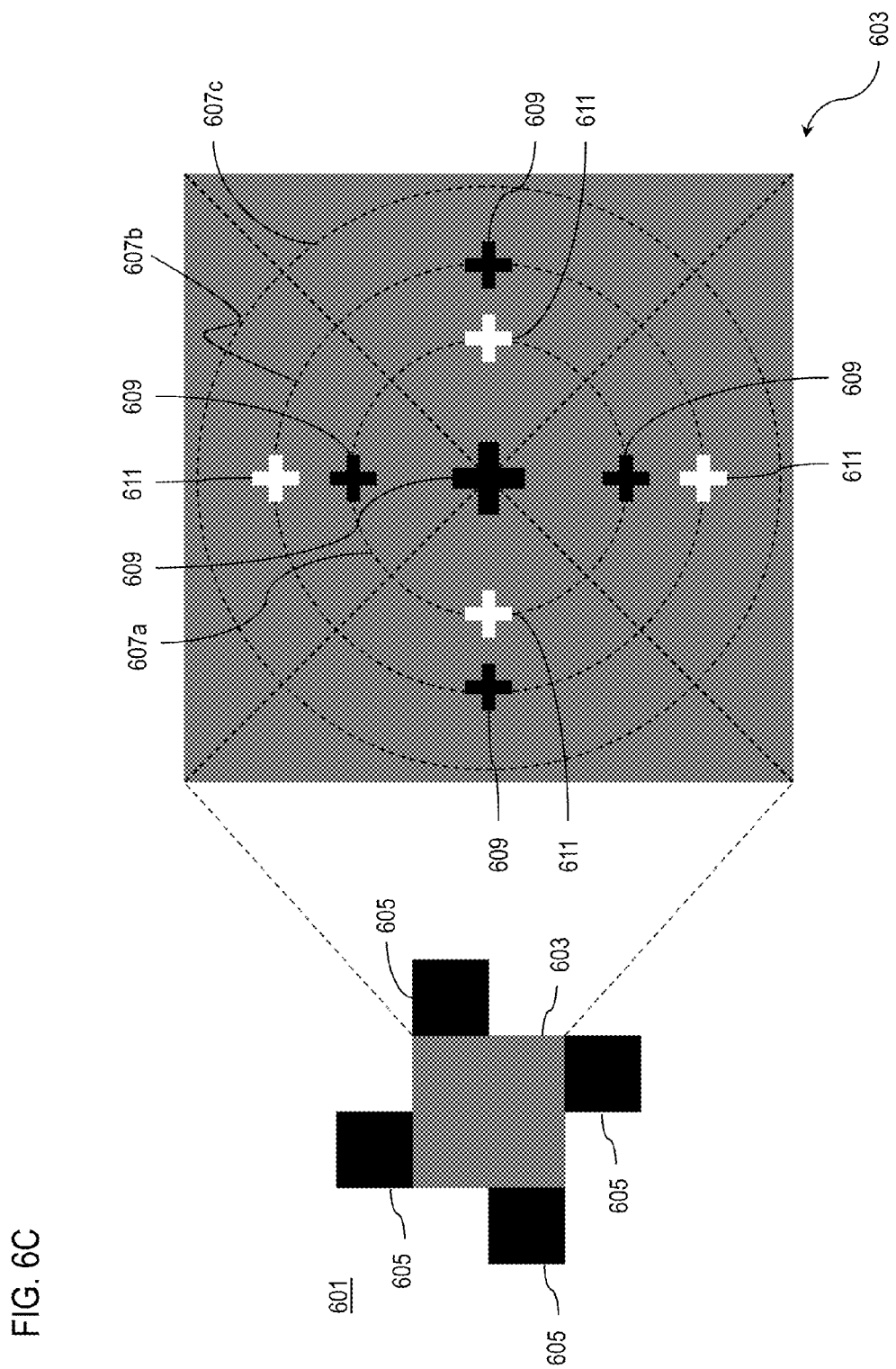

Second metal layer marks 611 are next added to the first shape 603, as illustrated in FIG. 6C. The second metal layer marks 611 correspond to a step for forming a second metal layer. Although the second metal layer marks 611 are illustrated as plus signs, the second metal layer marks 611 may be any shape. Alternatively, the second metal layer marks 611 may be any shape that is 90-degree rotationally symmetric. Further, the specific locations of the second metal layer marks 611 are not fixed such that the second metal layer marks 611 may be at any location within the first shape 603 along one or more of the concentric circles 607a-607c.

Figure 6D:
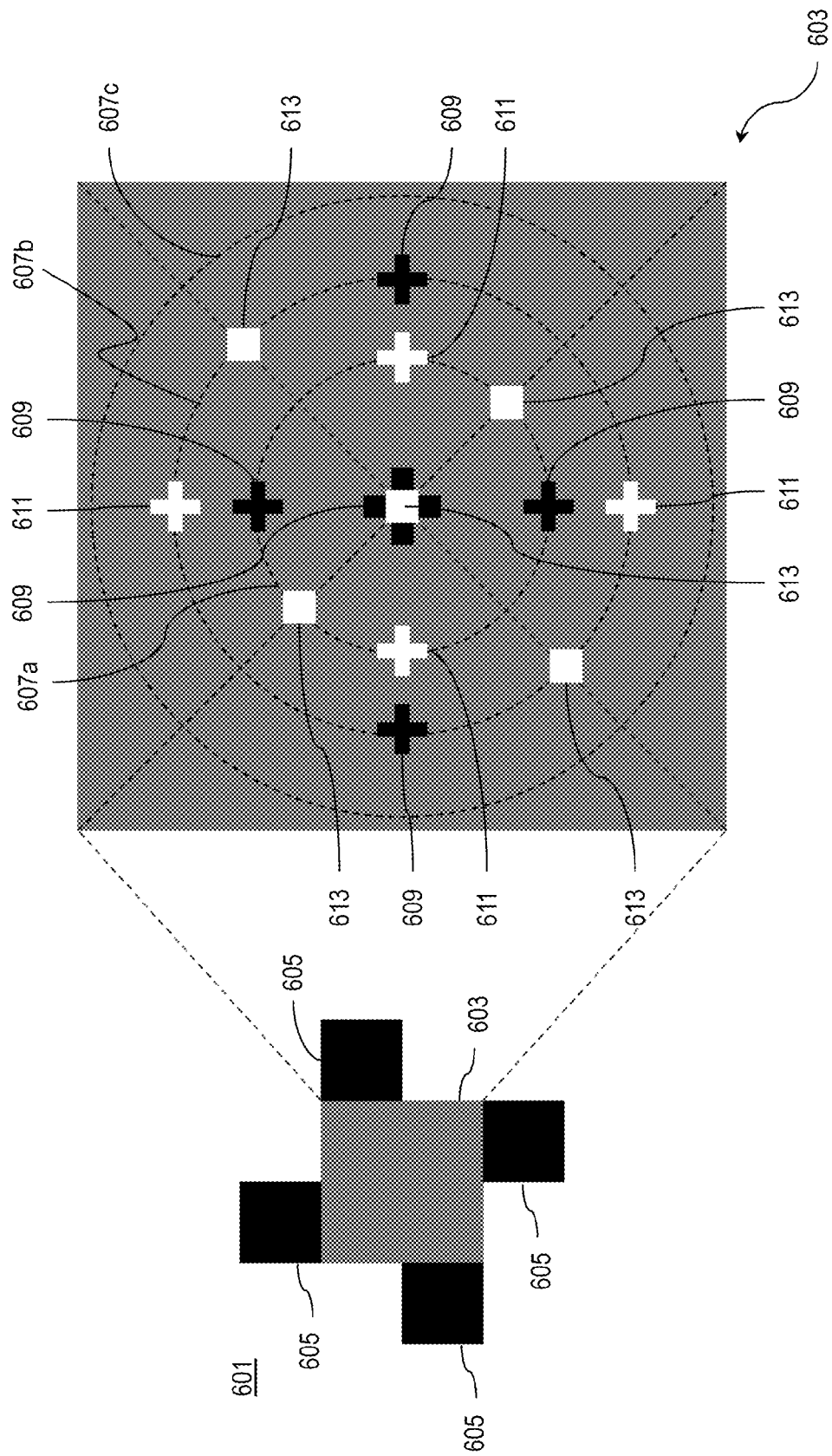

Then, first VIA marks 613 are added to the first shape 603, as illustrated in FIG. 6D. The first VIA marks 613 correspond to a step for forming first VIAs. Although the first VIA marks 613 are illustrated as squares, the first VIA marks 613 may be any shape. Alternatively, the first VIA marks 613 may be any shape that is 90-degree rotationally symmetric. Further, the specific locations of the first VIA marks 613 are not fixed such that the first VIA marks 613 may be at any location within the first shape 603 along one or more of the concentric circles 607a-607c. Although the first VIA marks 613 are illustrated in a pattern that is not 90-degree rotationally symmetric, the pattern of the first VIA marks 613 may alternatively be 90-degree rotationally symmetric.

Figure 6E:
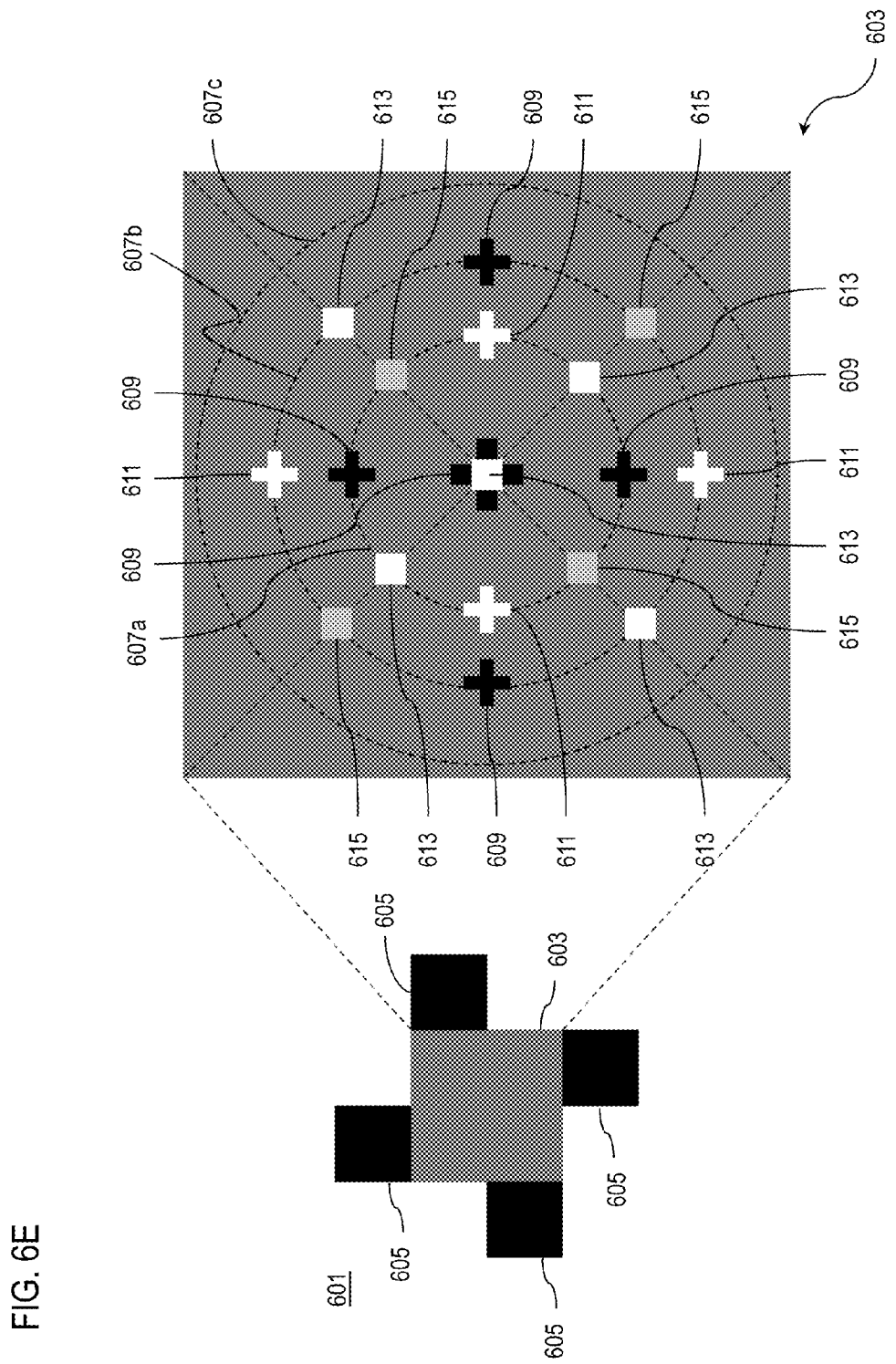

Subsequently, second VIA marks 615 are added to the first shape 603, as illustrated in FIG. 6E. The second VIA marks 615 correspond to a step for forming second VIAs. Although the second VIA marks 615 are illustrated as squares, the second VIA marks 615 may be any shape. Alternatively, the second VIA marks 615 may be any shape that is 90-degree rotationally symmetric. Further, the specific locations of the second VIA marks 615 are not fixed such that the second VIA marks 615 may be at any location within the first shape 603 along one or more of the concentric circles 607a-607c. Although the second VIA marks 615 are illustrated in a pattern that is not 90-degree rotationally symmetric, the pattern of the second VIA marks 615 may alternatively be 90-degree rotationally symmetric. The result is a first shape 603 in an alignment mark 601 that can be used for alignment while forming BEOL features of semiconductors devices.

Figure 7A:
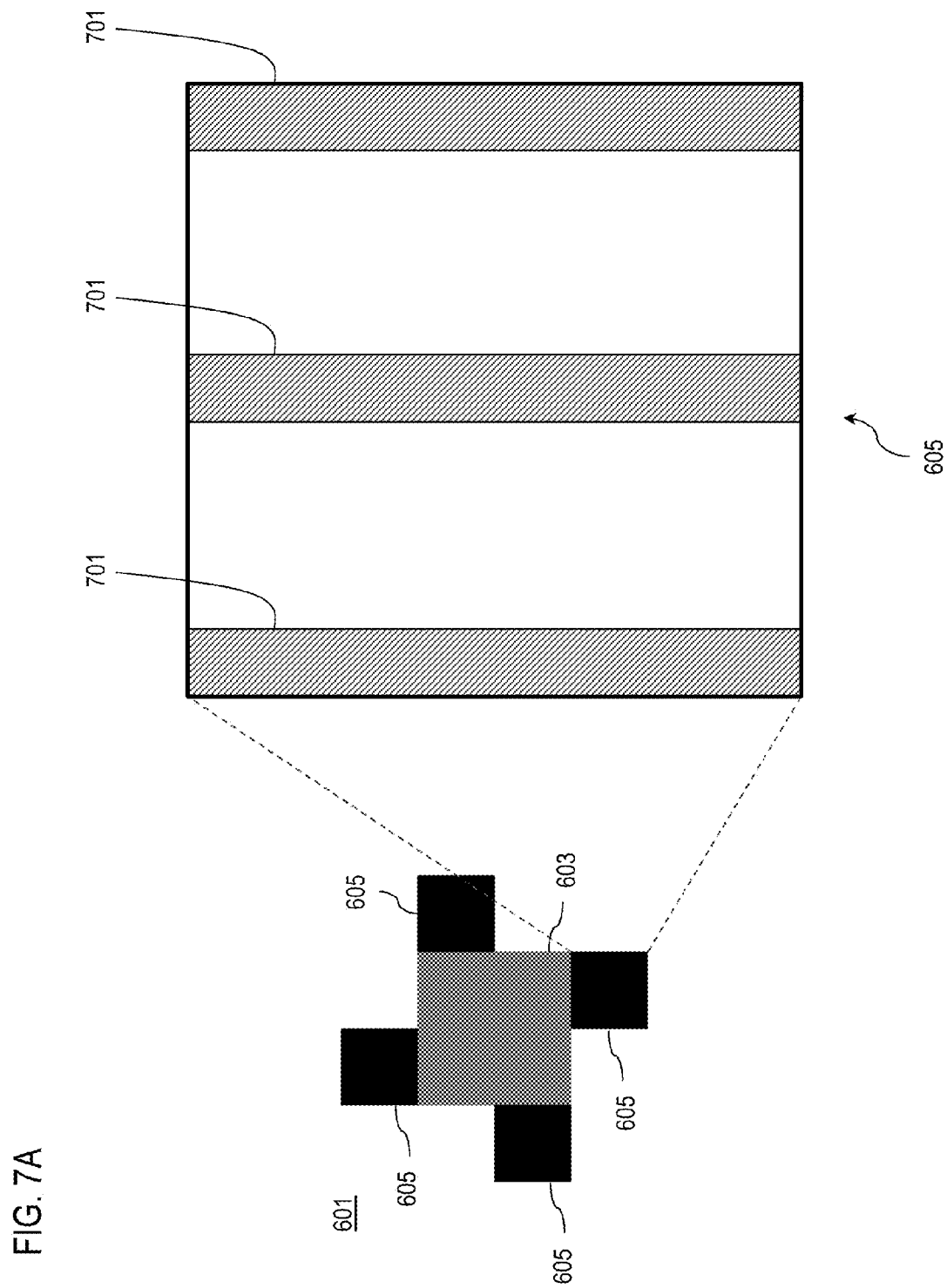

Adverting to FIG. 7A, the second shape 605 may also include additional detail for specific steps within a BEOL process flow. Vertical lines 701 are added to the second shape 605, as illustrated in FIG. 7A. The vertical lines 701 correspond to the formation of a first part of a metal 1 (e.g., M1) layer. Although there are three vertical lines 701, at the left edge, center and right edge of the second shape 605, the number, size and location of the vertical lines 701 may vary.

Figure 7B:
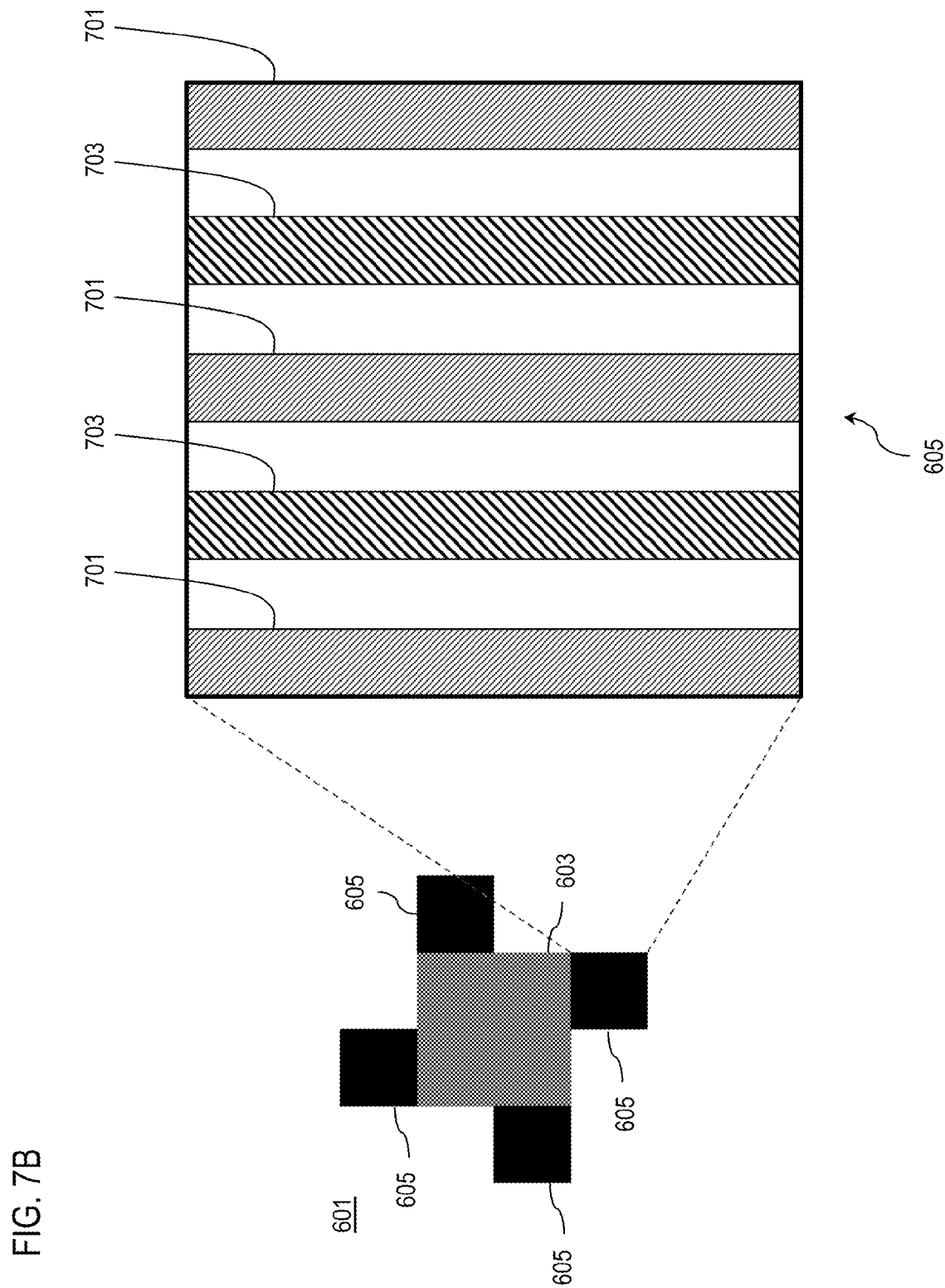

Vertical lines 703 are then added to the second shape 605, as illustrated in FIG. 7B. The vertical lines 703 correspond to the formation of a second part of the M1 layer. Although there are two vertical lines 703 at the left center and right center of the second shape 605, the number, size and location of the vertical lines 703 may vary. Vertical lines 701 and 703 may be used to form an M1 layer using double patterning. If the M1 layer is formed using triple patterning or above, the second shape 605 may include additional sets of vertical lines corresponding to a number of patterning steps, such as an additional set of vertical lines in combination with vertical lines 701 and 703 for triple patterning.

Next, horizontal lines 705 are added to the second shape 605, as illustrated in FIG. 7C. The horizontal lines 705 correspond to the formation of a first part of a metal 2 (e.g., M2) layer. Although there are three horizontal lines 705, at the top, center and bottom of the second shape 605, the number, size and location of the horizontal lines 705 may vary.

Figure 7D:
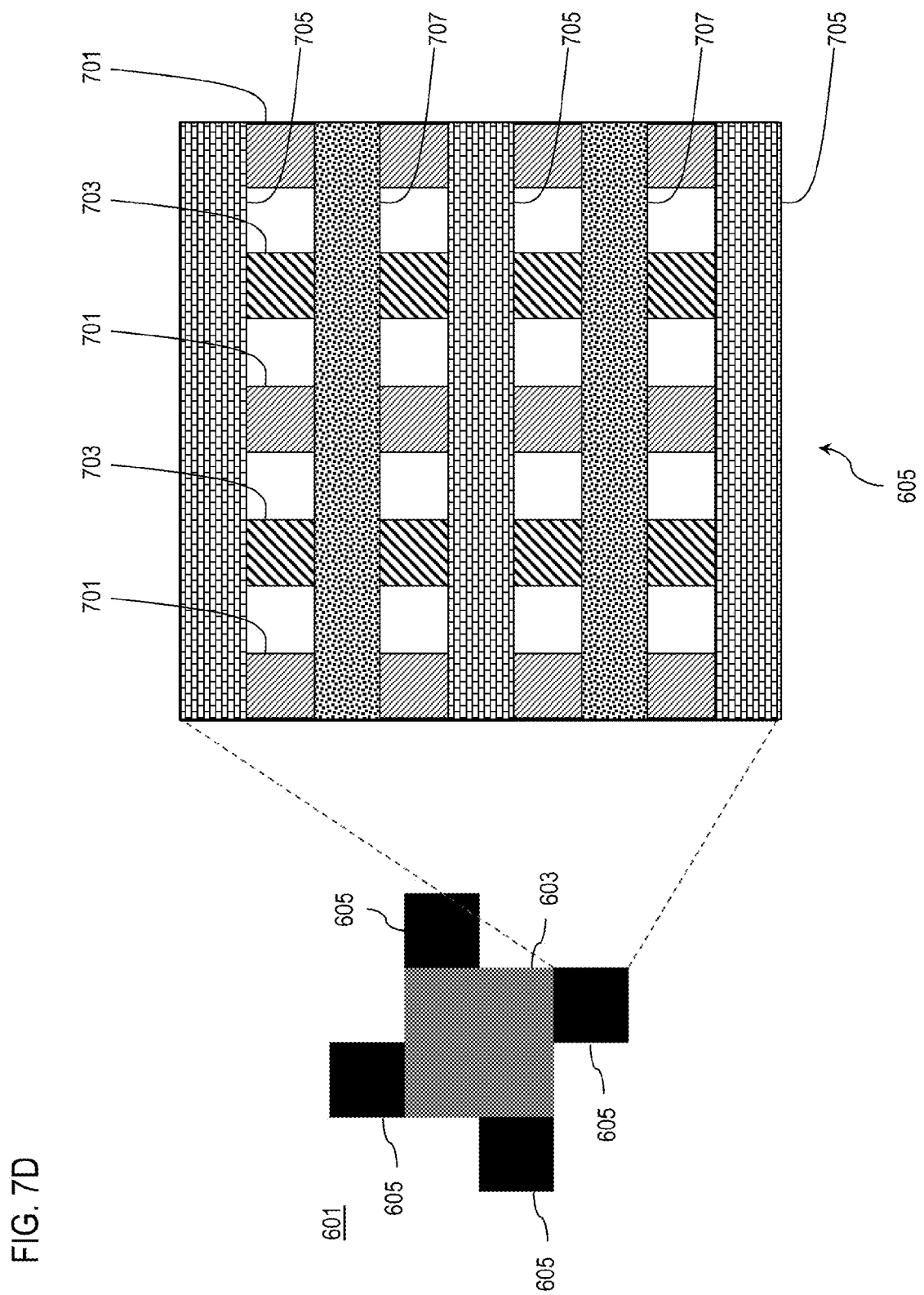

Horizontal lines 707 are then added to the second shape 605, as illustrated in FIG. 7D. The horizontal lines 707 correspond to the formation of a second part of the M2 layer. Although there are two horizontal lines 707, at the middle top and middle bottom of the second shape 605, the number, size and location of the horizontal lines 707 may vary. Similar to the vertical lines, horizontal lines 705 and 707 may be used to form an M2 layer using double patterning. If the M2 layer is formed using triple patterning or above, the second shape 605 may include additional sets of horizontal lines corresponding to a number of patterning steps, such as an additional set of horizontal lines in combination with horizontal lines 705 and 707 for triple patterning.

Figure 7E:
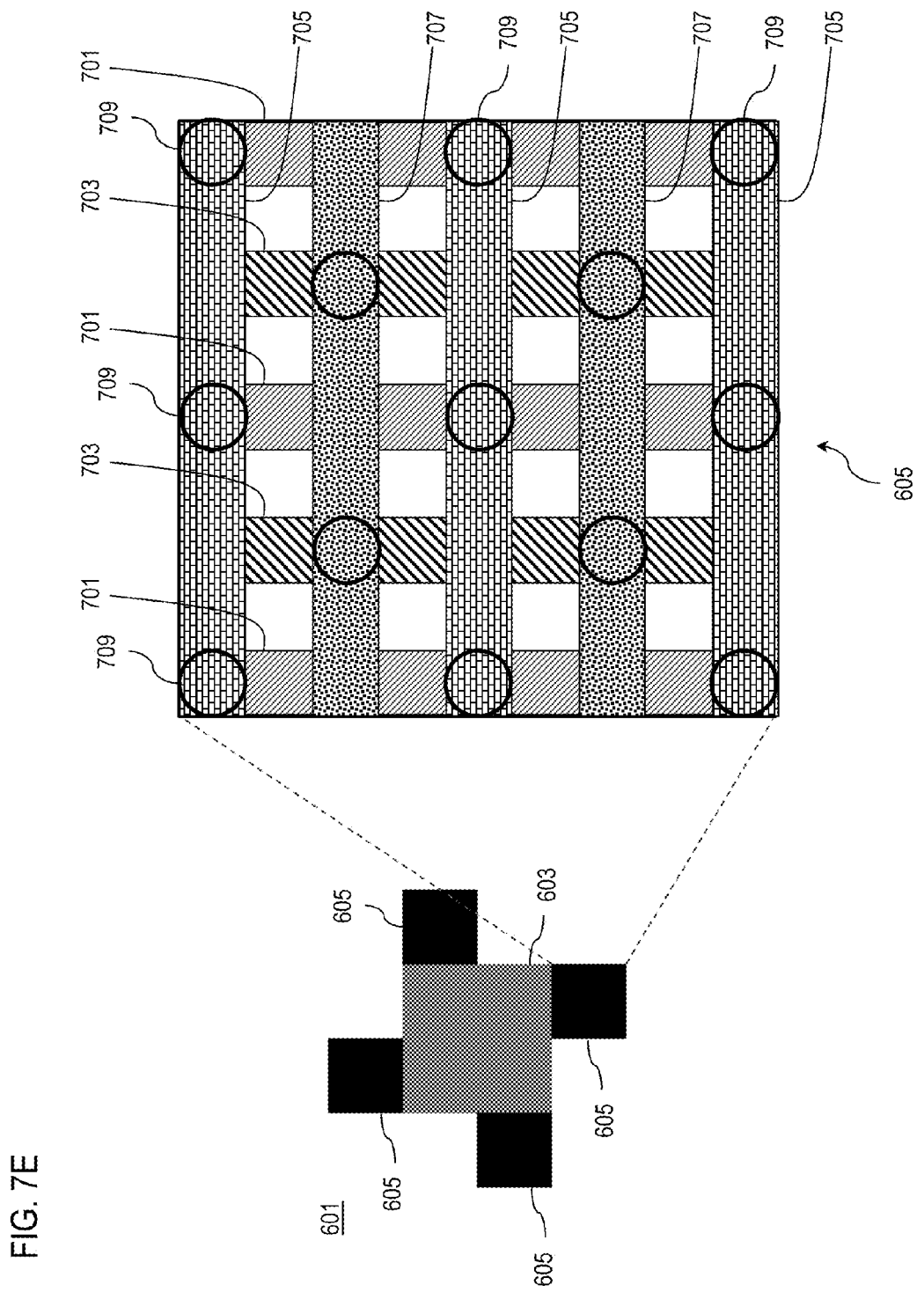

Circles 709 are then added to the second shape 605, as illustrated in FIG. 7E. The circles 709 correspond to the formation of a first part of a VIA layer. The circles 709 may be formed at intersections of the vertical lines 701 and the horizontal lines 705, as well as at the intersections of the vertical lines 703 and the horizontal lines 707. However, the number, size, shape, and location of the circles 709 may vary.

Figure 7F:
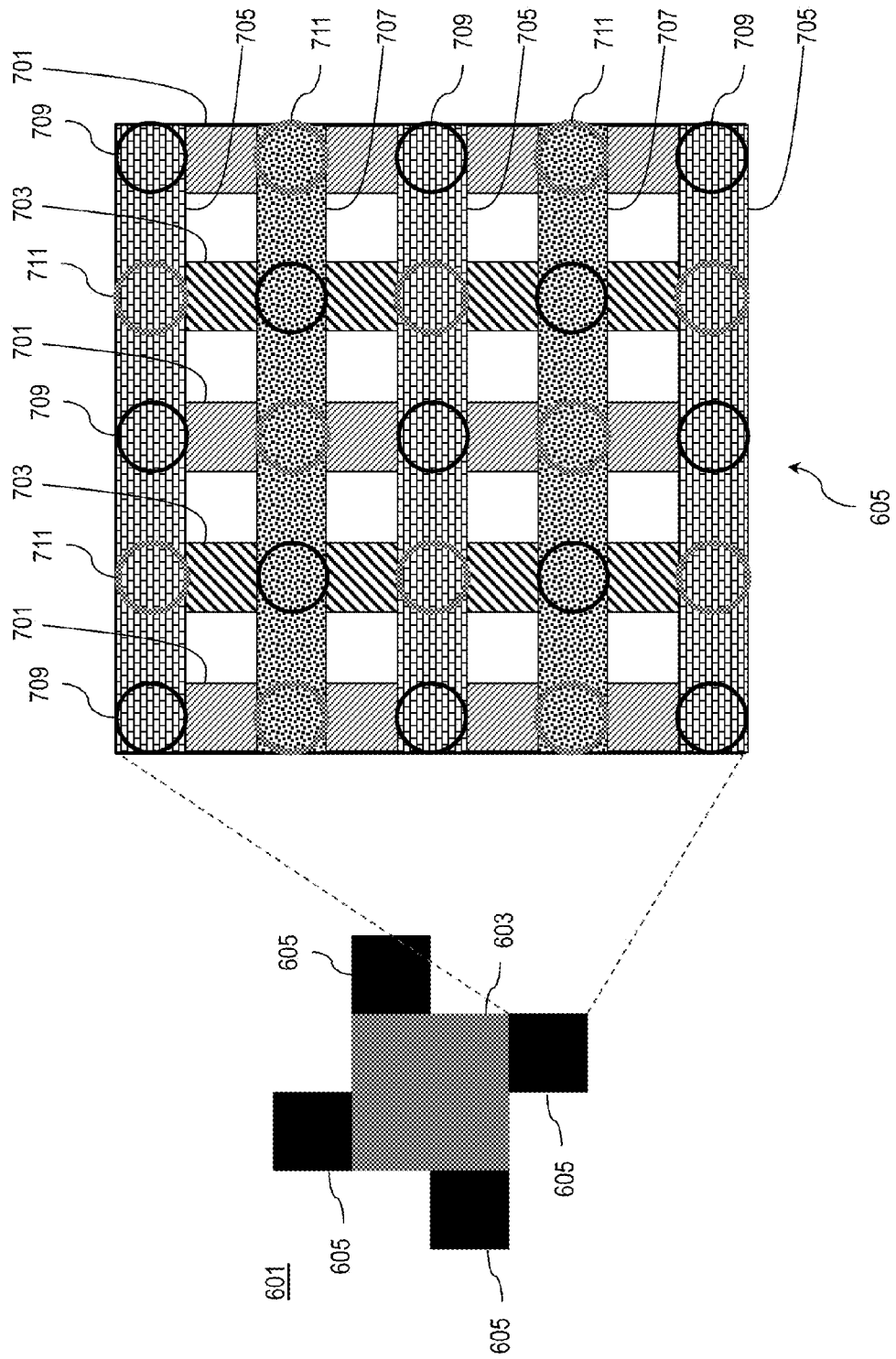

Next, circles 711 are added to the second shape 605, as illustrated in FIG. 7F. The circles 711 correspond to the formation of a second part of a VIA layer. The circles 711 may be formed at intersections of the vertical lines 703 and the horizontal lines 705, as well as at the intersections of the vertical lines 701 and the horizontal lines 707. However, the number, size, shape and location of the circles 711 may vary.

FIGS. 7G and 7H illustrate that the circles 709 and 711 may be formed to include features 713 that correspond to VIAs formed in the semiconductor devices. Although nine features 713 are illustrated in a 3×3 pattern, the number and shape of the features 713 may vary, such as the circles 709 and 711 including only one feature (e.g., 1×1) or more than nine features (e.g., 5×5). As the number of features 713 included within the circles 709 and 711 increases, the size of the features 713 decreases. Further, the number of features 713 within the circles 709 and 711 may correspond to a size of the VIAs such that a larger number of features 713 corresponds to smaller VIAs.

Figure 7I:
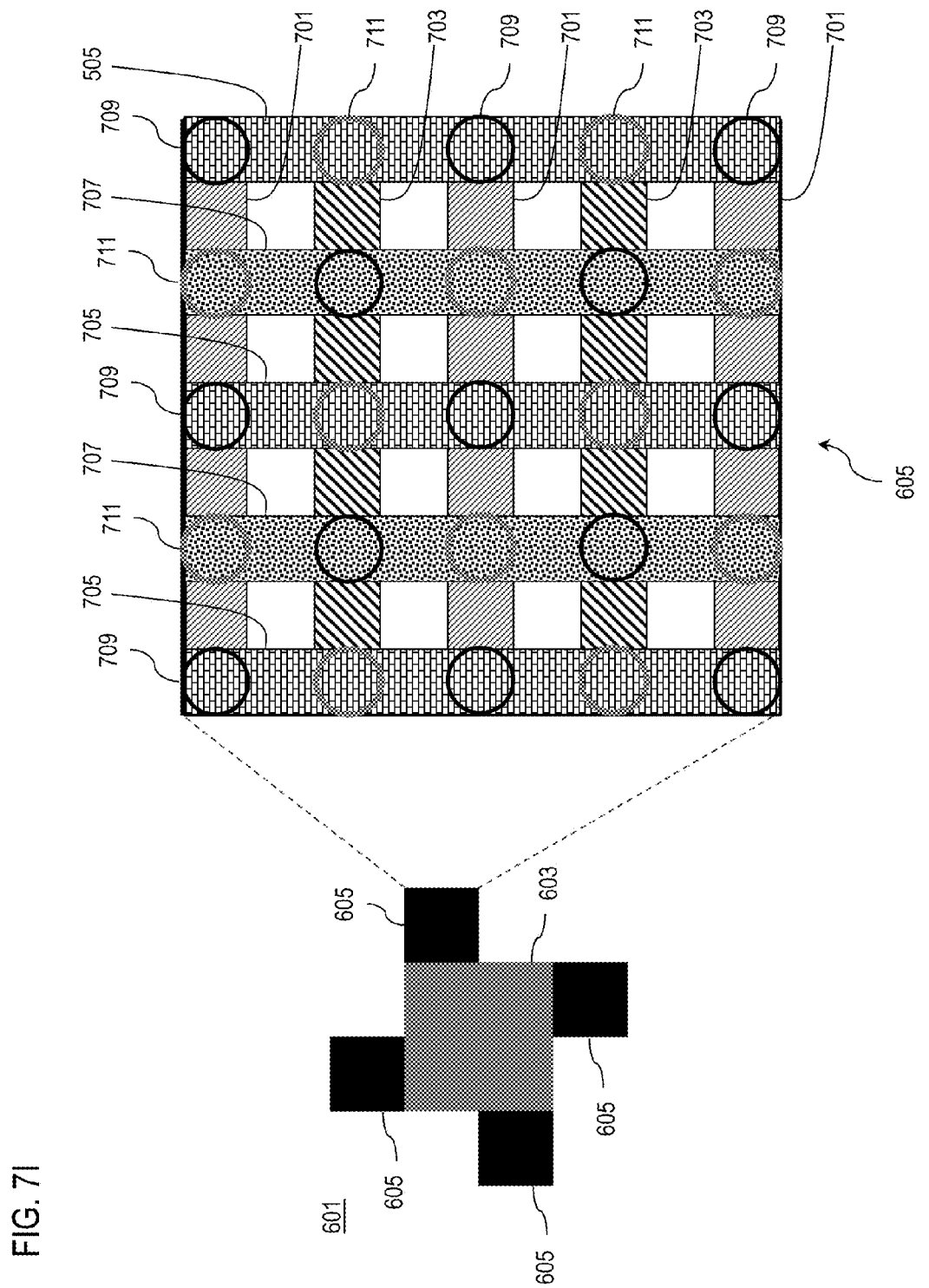

The result is a second shape 605 in an alignment mark 603 that can be used for alignment while forming BEOL features of semiconductors devices. Further, the result is a second shape 605 that is not rotationally symmetric, as illustrated in FIG. 7I, which shows a rotated version of the second shape 605 in FIG. 7F. Providing the alignment marks 301 and/or 601 uniformly distributed in the four corners of a reticle provide the overlay information for both the reticle and wafer.

The embodiments of the present disclosure achieve several technical effects, including providing general scanning electron microscope and optical alignment marks for single, double, and triple exposures, and beyond, providing an optical alignment mark for reticle inspection alignment, and providing overlay measurements. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras. Thus, the present disclosure is applicable to any of various highly integrated semiconductor devices, particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first shape having rotational symmetry;
   forming a second shape;
   forming an alignment mark by combining the first shape and one or more of the second shape; and
   forming one or more concentric outlines within the first shape corresponding to a number of levels of exposure,
   wherein the alignment mark has rotational symmetry.

2. The method according to claim 1, comprising:
   forming the alignment mark by combining the first shape with four of the second shape.

3. The method according to claim 2, comprising:
   placing an edge of each one of the four second shapes contiguous with a separate edge of the first shape to form the alignment mark.

4. The method according to claim 1, wherein the first shape is a square and the second shape is a quadrilateral.

5. The method according to claim 1, further comprising:
   forming rotationally symmetric shapes along the one or more concentric outlines corresponding to features formed in the levels of exposure.

6. The method according to claim 1, further comprising:
   forming a cross-hatched grid of lines within the second shape corresponding to features formed in a number of levels of exposure.

7. The method according to claim 6, further comprising:
   forming rotationally symmetric shapes at intersections of the cross-hatched grid of lines.

8. An apparatus comprising:
   a substrate; and
   one or more rotationally symmetric alignment marks on the substrate,
   wherein the one or more rotationally symmetric alignment marks comprise:
     a first shape having rotational symmetry, and the first shape having one or more concentric outlines corresponding to a number of levels of exposure; and
     at least one of a second shape.

9. The apparatus according to claim 8, the one or more alignment marks comprise four of the second shape.

10. The apparatus according to claim 9, the one or more alignment marks comprising:
    an edge of each one of the four second shapes being contiguous with a separate edge of the first shape.

11. The apparatus according to claim 8, wherein the first shape is a square and the second shape is a quadrilateral.

12. The apparatus according to claim 8, the first shape further comprising:
    rotationally symmetric shapes along the one or more concentric outlines corresponding to features formed in the levels of exposure.

13. The apparatus according to claim 8, the second shape further comprising:
   a cross-hatched grid of lines corresponding to features formed in a number of levels of exposure.

14. The apparatus according to claim 13, the second shape further comprising:
   rotationally symmetric shapes at intersections of the cross-hatched grid of lines.

15. A method comprising:
   forming a first shape having 90-degree rotational symmetry;
   forming at least one of a second shape, with an edge of each of the at least one second shape being contiguous with a separate edge of the first shape, forming an alignment mark;
   forming one or more concentric outlines within the first shape corresponding to a number of levels of exposure; and
   forming 90-degree rotationally symmetric shapes along the one or more concentric outlines corresponding to features formed in the levels of exposure,
   wherein the alignment mark has 90-degree rotational symmetry.

16. The method according to claim 15, further comprising:
   forming a cross-hatched grid of lines within the second shape corresponding to features formed in a number of levels of exposure; and
   forming rotationally symmetric shapes at intersections of the cross-hatched grid of lines.

17. The method according to claim 15, wherein the first shape is a square and the second shape is a quadrilateral.

* * * * *